(12) United States Patent
Chiba et al.

(10) Patent No.: US 10,940,848 B2
(45) Date of Patent: Mar. 9, 2021

(54) ELECTRIC COMPONENT ASSEMBLY, AND BRAKE FLUID PRESSURE CONTROL DEVICE FOR VEHICLE

(71) Applicants: NISSIN KOGYO CO., LTD., Tomi (JP); Veoneer Nissin Brake Systems Japan CO., LTD., Yokohama (JP)

(72) Inventors: Kentaro Chiba, Tomi (JP); Takaaki Komaba, Yokohama (JP)

(73) Assignees: Nissin Kogyo Co., Ltd., Nagano (JP); Veoneer Nissin Brake Systems Japan Co., Ltd., Kanagawa (JP)

( * ) Notice: Subject to any disclaimer, the term of this patent is extended or adjusted under 35 U.S.C. 154(b) by 0 days.

(21) Appl. No.: 16/486,727

(22) PCT Filed: Feb. 16, 2018

(86) PCT No.: PCT/JP2018/005539
§ 371 (c)(1),
(2) Date: Aug. 16, 2019

(87) PCT Pub. No.: WO2018/151265
PCT Pub. Date: Aug. 23, 2018

(65) Prior Publication Data
US 2019/0381984 A1 Dec. 19, 2019

(30) Foreign Application Priority Data
Feb. 17, 2017 (JP) .............................. JP2017-028532

(51) Int. Cl.
*B60T 15/02* (2006.01)
*F16K 31/06* (2006.01)
(Continued)

(52) U.S. Cl.
CPC .......... *B60T 15/021* (2013.01); *B60T 15/025* (2013.01); *F16K 31/06* (2013.01); *H05K 5/0095* (2013.01); *H01F 7/06* (2013.01)

(58) Field of Classification Search
CPC .... B60T 15/021; B60T 15/025; B60T 15/028; B60T 15/36
(Continued)

(56) References Cited

U.S. PATENT DOCUMENTS

| 5,513,905 A | 5/1996 | Zeides et al. |
| 6,702,403 B2 * | 3/2004 | Haller ..................... B60T 8/368 |
| | | 303/116.4 |

(Continued)

FOREIGN PATENT DOCUMENTS

| EP | 0 658 463 A2 | 6/1995 |
| EP | 2 703 241 A1 | 3/2014 |

(Continued)

OTHER PUBLICATIONS

Extended European search report issued in the corresponding EP Patent Application No. 18754409.3 dated Jun. 22, 2020.
(Continued)

*Primary Examiner* — Melanie Torres Williams
(74) *Attorney, Agent, or Firm* — Carrier Blackman & Associates, P.C.; Joseph P. Carrier; Fulchand P. Shende

(57) ABSTRACT

An electric component assembly includes a housing with which an electric component is fitted together, and the electric component and the housing are fixed to one side of a base body. The electric component includes a connecting terminal configured to be press-fitted in a through-hole of the control board of the housing, and a direction in which the connecting terminal is inserted into the through-hole is same as a fitting direction relative to the housing. There are provided a rib protruding from one of the electric component and the housing, and a groove portion recessed from another one of the electric component and the housing and into which the rib is press-fitted. Movement of the electric component in a direction intersecting the fitting direction and rotation of the electric component around an axis parallel to the fitting direction are restrained by the rib press-fitted into the groove portion.

7 Claims, 21 Drawing Sheets

(51) Int. Cl.
  *H05K 5/00* (2006.01)
  *H01F 7/06* (2006.01)
(58) Field of Classification Search
  USPC .................................................. 303/DIG. 10
  See application file for complete search history.

(56) References Cited

U.S. PATENT DOCUMENTS

| | | | | |
|---|---|---|---|---|
| 8,246,121 | B2* | 8/2012 | Homann | F15B 13/086 |
| | | | | 303/119.1 |
| 8,801,113 | B2* | 8/2014 | Terashima | B60T 13/662 |
| | | | | 303/119.3 |
| 2004/0207256 | A1* | 10/2004 | Volz | B60T 8/4072 |
| | | | | 303/119.3 |

FOREIGN PATENT DOCUMENTS

| | | |
|---|---|---|
| JP | S56-11169 U1 | 1/1981 |
| JP | 2010-234826 A | 10/2010 |
| JP | 2011-150807 A | 8/2011 |
| JP | 2012-241845 A | 12/2012 |

OTHER PUBLICATIONS

PCT/ISA/210 from International Patent Application PCT/JP2018/005539 and the English translation thereof.
PCT/ISA/237 (Written Opinion) from International Patent Application PCT/JP2018/005539.

* cited by examiner

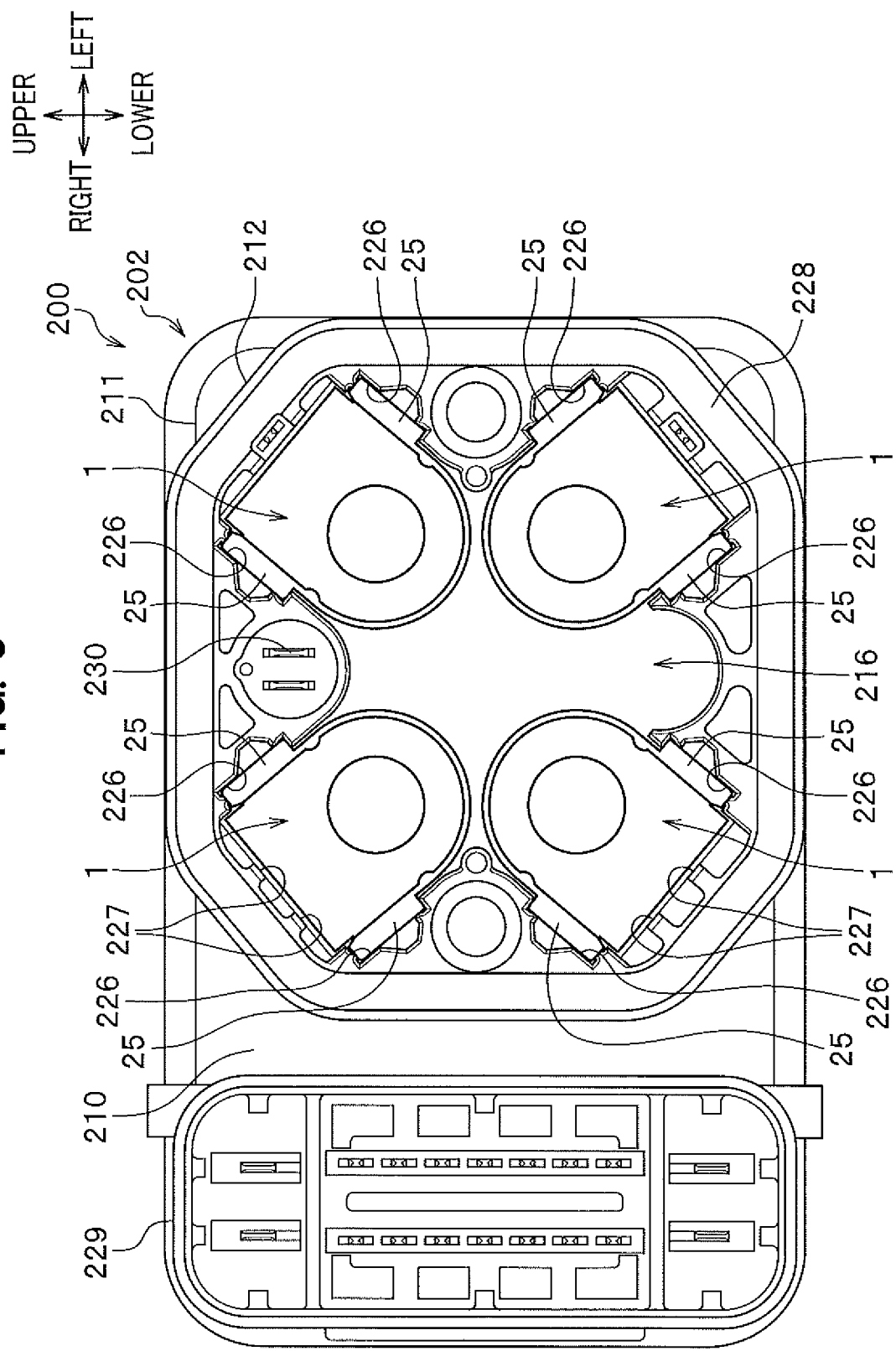

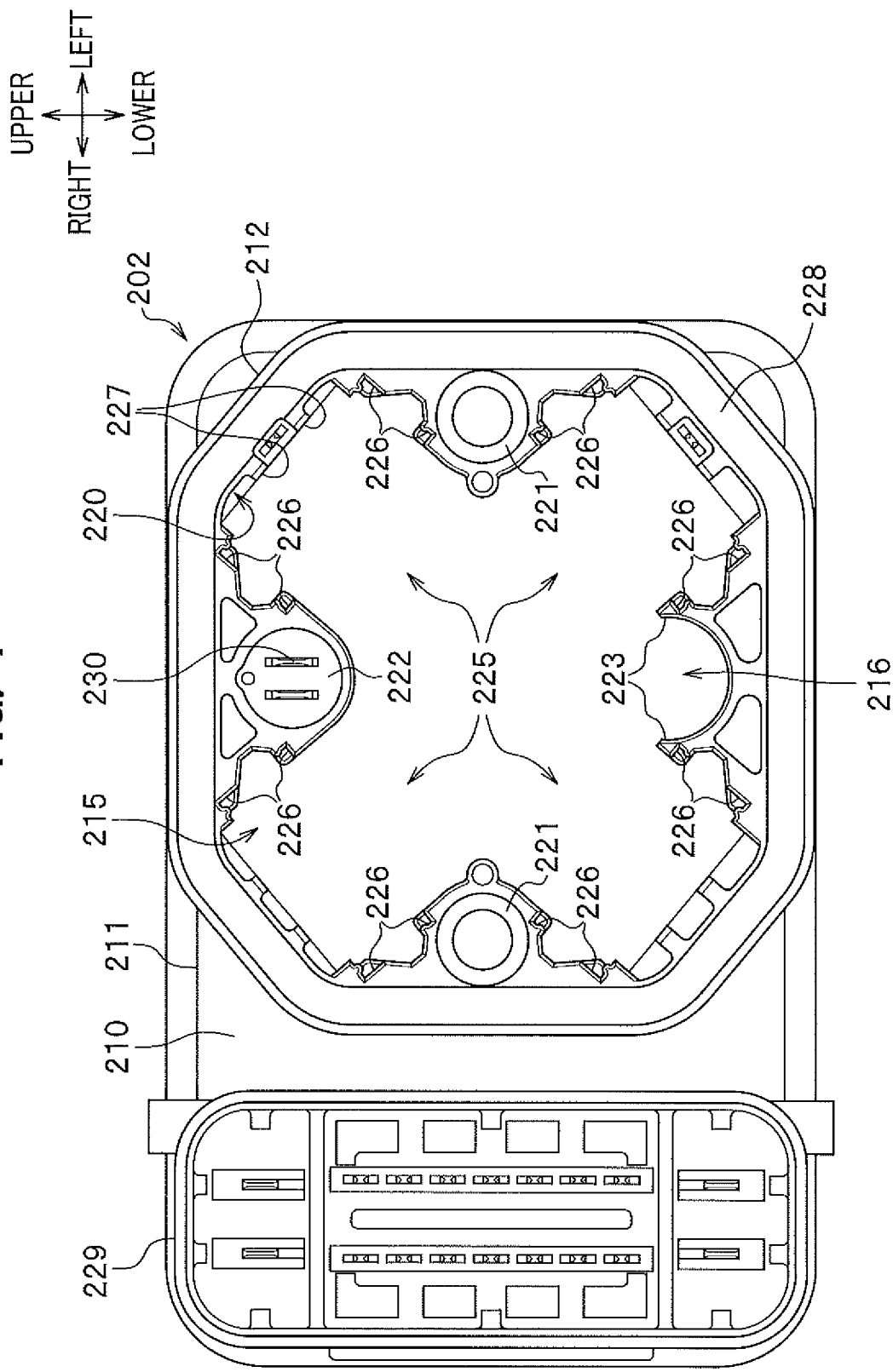

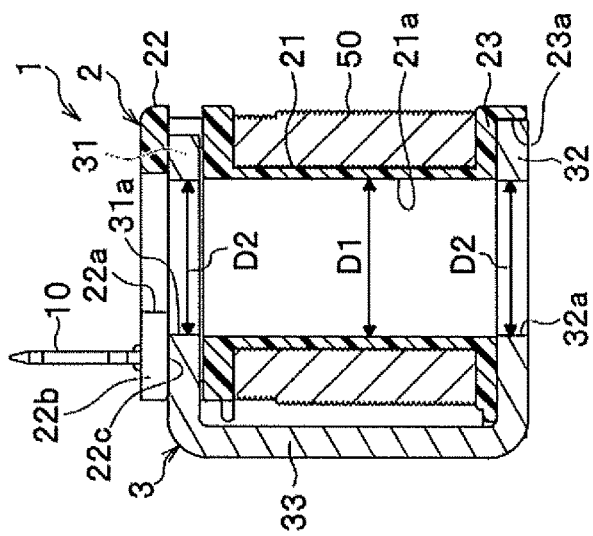
FIG. 6D
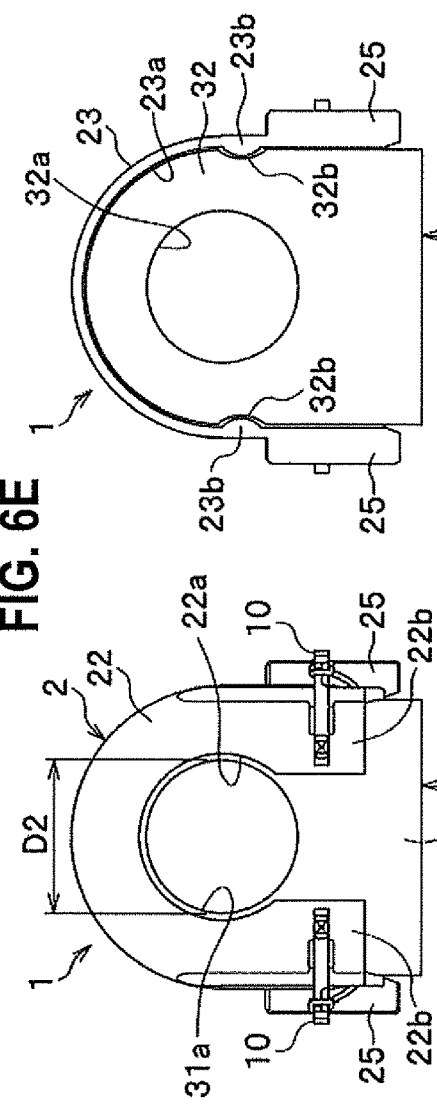
FIG. 6E
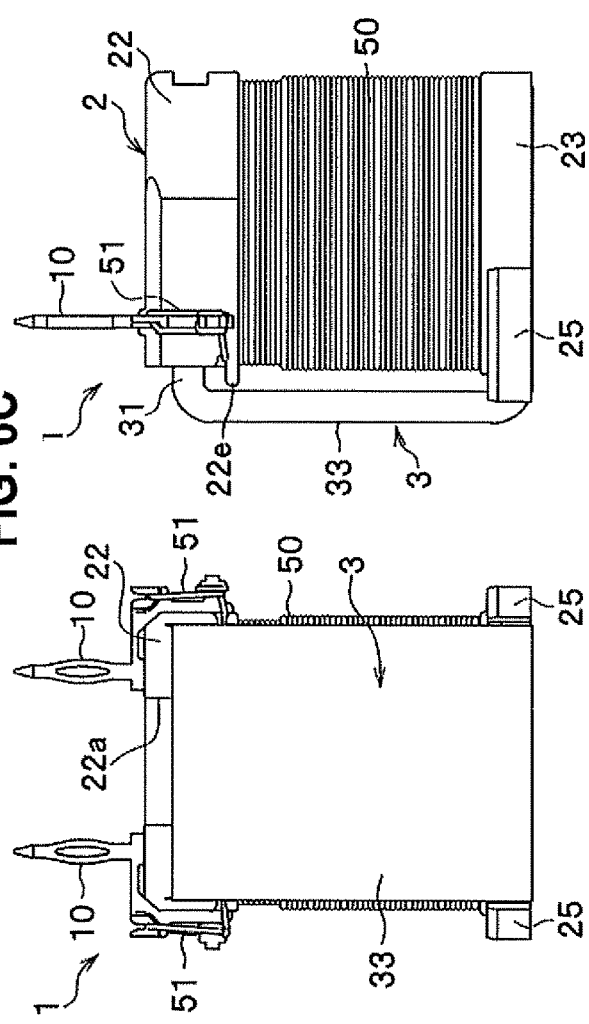
FIG. 6A
FIG. 6C
FIG. 6B

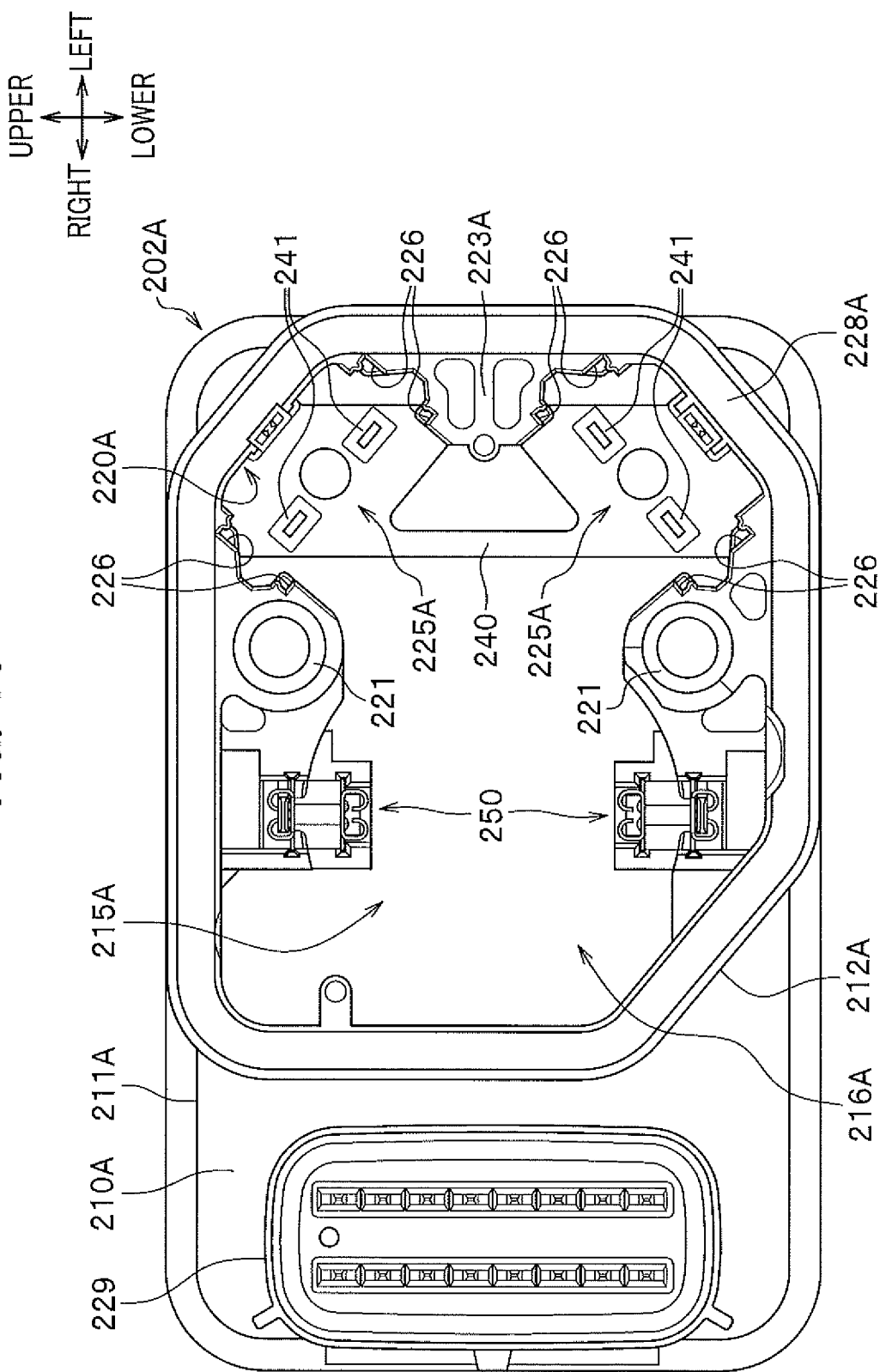

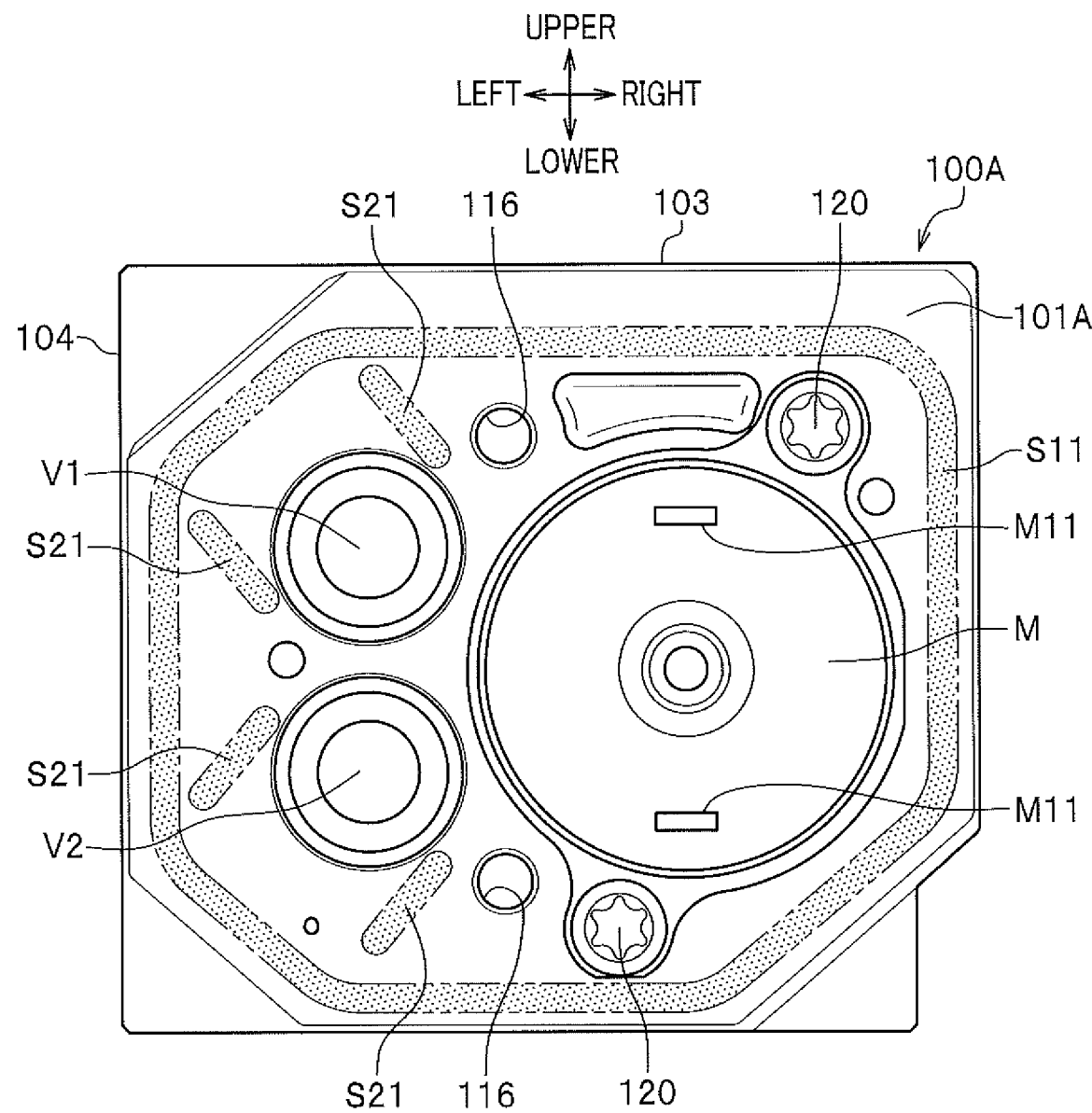

ELECTRIC COMPONENT ASSEMBLY, AND BRAKE FLUID PRESSURE CONTROL DEVICE FOR VEHICLE

TECHNICAL FIELD

The present invention relates to an electric component assembly and a brake fluid pressure control device for vehicles.

BACKGROUND ART

In brake systems for vehicles such as two-wheeled vehicles and four-wheeled vehicles, some conventionally known systems are equipped with a brake fluid pressure control device for vehicles for the purpose of controlling brake fluid pressure acting on wheel brakes. A brake fluid pressure control device for vehicles, including a base body, brake fluid passages formed within the base body, and solenoid valves mounted on one side of the base body, is known (see for example, Patent document 1). An electric component assembly including coil assemblies as electric components attached to solenoid valves, and a housing covering the coil assemblies and the solenoid valves is mounted on one side of a base body. The coil assemblies are connected to a control board disposed in the housing.

In this brake fluid pressure control device for vehicles, the control board controls energization over the coil assemblies to open and close the solenoid valves, so that brake fluid pressures within brake fluid passages change to control braking force at each wheel brake.

CITATION LIST

Patent Documents

Patent document 1: Japanese Laid-open Patent Application, Publication No. 2011-150807

SUMMARY OF THE INVENTION

Technical Problem

In the brake fluid pressure control device for vehicles according to Patent document 1, each coil assembly and the control board are connected together using a pair of press-fit terminals. However, the coil assembly according to Patent document 1 does not include a specific fixing structure relative to the housing. For this reason, to connect a press-fit terminal to the control board, it is necessary to position and hold the coil assembly in advance using a jig or other means. Accordingly, a space is required between the coil assembly and the control board to install the jig or the like. Further, there is a need to provide the coil assembly with an attachment portion to which the jig is attached. This disadvantageously results in a complicated configuration of the coil assembly and enlarged size of the device in the axial direction of the connecting terminal.

Further, in the coil assembly according to Patent document 1, it is necessary to provide the terminal with a stress relaxation mechanism for absorbing relative positional shift of tip end portions of the terminals relative to the through-holes of the control board when connecting the terminals. This disadvantageously results in a complicated configuration of the coil assembly.

The present invention seeks to provide an electric component assembly and a brake fluid pressure control device for vehicles, in which an electric component can be fitted together without using an assembling jig, and in which the space for installing the jig can be eliminated to achieve compactness and simplification of the configuration of the electric component.

Solution to Problem

To solve the above problems, the present invention seeks to provide an electric component assembly comprising: an electric component; and a housing with which the electric component is fitted together, the electric component and the housing being fixed to one side of a base body. The electric component includes a connecting terminal configured to be press-fitted in a through-hole of a circuit board installed in the housing, and a direction in which the connecting terminal is inserted into the through-hole is same as a fitting direction of the electric component relative to the housing. The electric component assembly includes a rib protruding from one of the electric component and the housing, and a groove portion recessed from another one of the electric component and the housing and into which the rib is press-fitted. Movement of the electric component in a direction intersecting the fitting direction and rotation of the electric component around an axis parallel to the fitting direction are restrained by the rib press-fitted into the groove portion.

The electric component assembly according to the present invention can restrain the direction intersecting the fitting direction, and the rotation around an axis parallel to the fitting direction by the rib press-fitted into the groove portion. This makes it possible to fix the electric component to a predetermined position of the housing without using an assembling jib or other means. Accordingly, the connecting terminal can be disposed in a predetermined position of the housing with great precision, and the connecting terminal can be connected to the control board with ease without using an assembling jig or other means. This eliminates the need to provide a space for installing the jig which would be required in the conventional device upon connection of the connecting terminal, and thus the size reduction corresponding to this installation space can be attained. Further, it is not necessary to provide the electric component with an attachment portion to which the jig is attached, so that the configuration of the electric component can be simplified.

In the above-described electric component assembly, it is preferable that the connecting terminal is a press-fit terminal. Use of the press-fit terminal improves assembly because the terminal and the control board can be connected with ease.

In the above-described electric component assembly, the electric component is a coil assembly configured to drive a solenoid valve. Preferably, the coil assembly includes: a bobbin; a coil comprising a winding around the bobbin; a yoke mounted on the bobbin; and the connecting terminal electrically connected to the winding.

The present invention seeks to provide a brake fluid pressure control device for vehicles comprising the above-described electric component assembly, and configured to be connected between a master cylinder and a wheel brake and to control brake fluid pressure acting on the wheel brake. The brake fluid pressure control device for vehicles is configured such that the solenoid valve is mounted on the base body and the coil assembly is attached to the solenoid valve.

In the brake fluid pressure control device for vehicles according to the present invention, the size of the electric component assembly can be reduced and the configuration of the electric component can be simplified, so that miniaturization of the overall device and cost-reduction can be attained. Further, since the overall device can be miniaturized, the fitting operation of the device relative to a vehicle can be improved as well.

Advantageous Effects of the Invention

According an electric component assembly and a brake fluid pressure control device for vehicle of the present invention, an electric component can be fitted together without using an assembling jig, and the space for installing the jig can be eliminated to achieve compactness and simplification of the configuration of the electric component.

BRIEF DESCRIPTION OF THE DRAWINGS

FIG. 3 is a rear view illustrating the electric component assembly according to the first embodiment.

FIG. 4 is a rear view illustrating a housing that is a constituent element of the electric component assembly according to the first embodiment.

FIGS. 5A to 5B are views illustrating a coil assembly according the first embodiment, in which FIG. 5A is a perspective view thereof as seen from a side where a yoke is disposed, and FIG. 5B is an enlarged perspective view illustrating a press-fit terminal portion.

FIGS. 6A to 6E are views illustrating the coil assembly, in which FIG. 6A is a top view, FIG. 6B is a rear view, FIG. 6C is a right side view, FIG. 6D is a vertical sectional view, and FIG. 6E is a bottom view; in these views, a rear side is defined as a side where the yoke is disposed.

FIGS. 7A to 7D are views illustrating the press-fit terminal as a constituent element of the coil assembly according to the first embodiment, in which FIG. 7A is a front view, FIG. 7B is a left side view, FIG. 7C is a rear view, and FIG. 7D is an enlarged rear view showing a major portion thereof.

FIGS. 8A and 8B are views illustrating the electric component assembly according to the first embodiment, in which FIG. 8A is a partial perspective view illustrating a process of fitting the coil assembly together with the housing, and FIG. 8B is a partial sectional view illustrating the coil assembly having been fitted together with the housing.

FIG. 15 is a rear view illustrating the housing according to the second embodiment.

FIGS. 16A and 16B are views illustrating a coil assembly according to the second embodiment, in which FIG. 16A is a perspective view thereof as seen from a side where a yoke is disposed, and FIG. 16B is an enlarged perspective view illustrating a press-fit terminal portion.

FIGS. 17A to 17C are views illustrating the press-fit terminal according to the second embodiment, in which FIG. 17A is a front view, FIG. 17B is a left side view, and FIG. 17C is a rear view.

FIGS. 18A and 18B are views illustrating the electric component assembly according to the second embodiment, in which FIG. 18A is a partial perspective view illustrating a process of fitting the coil assembly together with the housing, and FIG. 18B is a partial sectional view illustrating the coil assembly having been fitted together with the housing.

FIG. 21 is a front view illustrating a bonding area of the base body adapted to the brake fluid pressure control device for vehicles according to the second embodiment.

DESCRIPTION OF EMBODIMENTS

One embodiment of the present invention will be described below with reference to the drawings where necessary. In the following description, front, rear, upper and lower directions of a brake fluid pressure control device for vehicles refer to the directions of FIG. 1, and right and left directions thereof refer to the directions of FIGS. 3 and 4. Further, front, rear, right, left, upper and lower directions of a coil assembly as an electric component refer to the directions of FIG. 5A, the purpose of which, however, is not to limit the fitting direction of the coil assembly relative to the brake fluid pressure control device for vehicles.

First Embodiment

In this embodiment, an exemplified configuration will be described, in which an electric component assembly according to the present invention is adapted to a brake fluid pressure control device for two-wheeled vehicles equipped with two brake systems. Of course, the electric component assembly may be adapted to a brake fluid pressure control device for four-wheeled vehicles.

Configuration of Brake Fluid Pressure Control Device for Vehicles

A brake fluid pressure control device U for vehicles is connected between a master cylinder (not shown) and wheel brakes (not shown), and controls brake fluid pressures acting on the wheel brakes.

Figure 1:
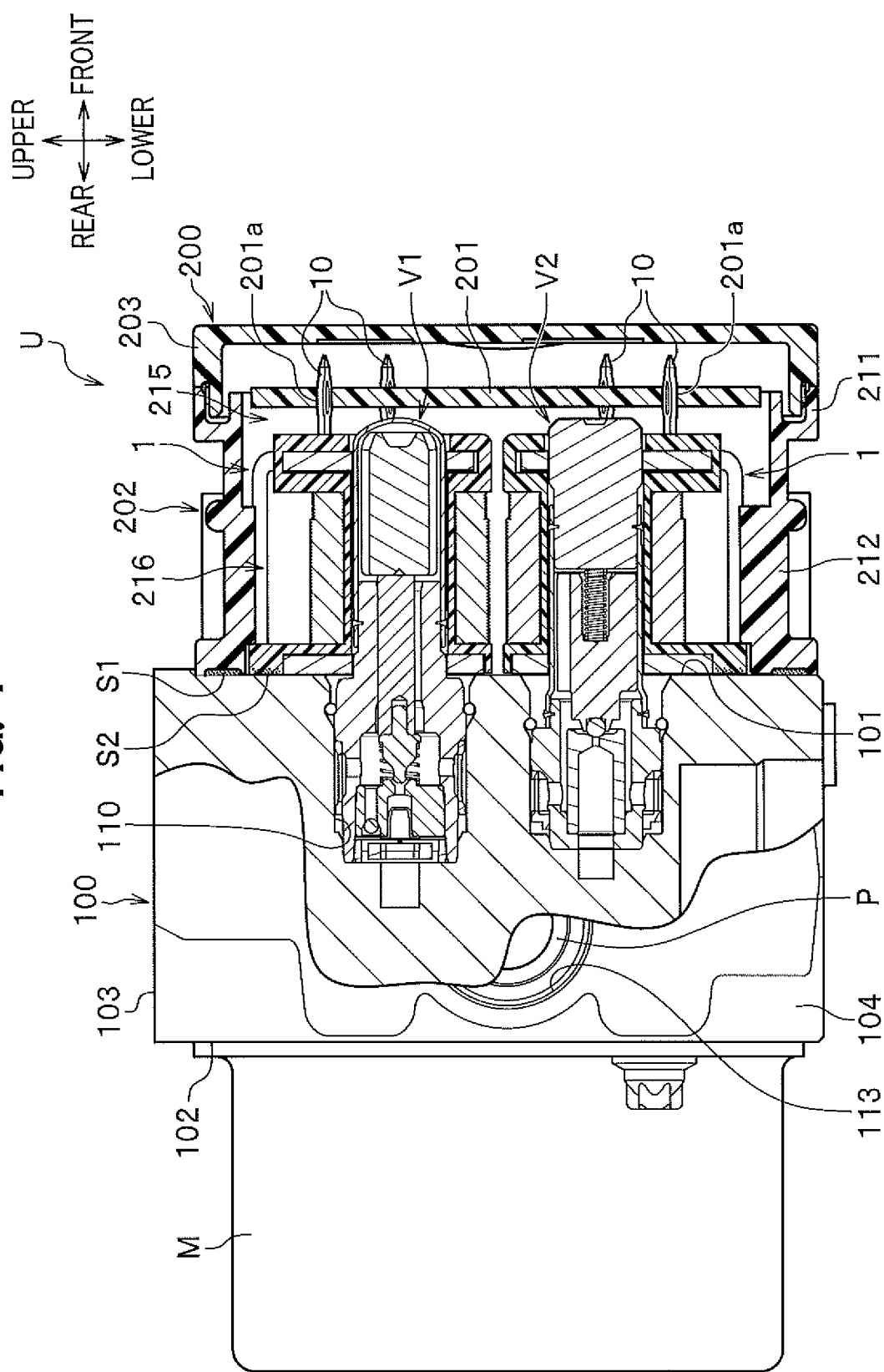
FIG. 1 is a side sectional view illustrating a brake fluid pressure control device for vehicles, which is equipped with an electric component assembly according to a first embodiment of the present invention.
Figure 2:
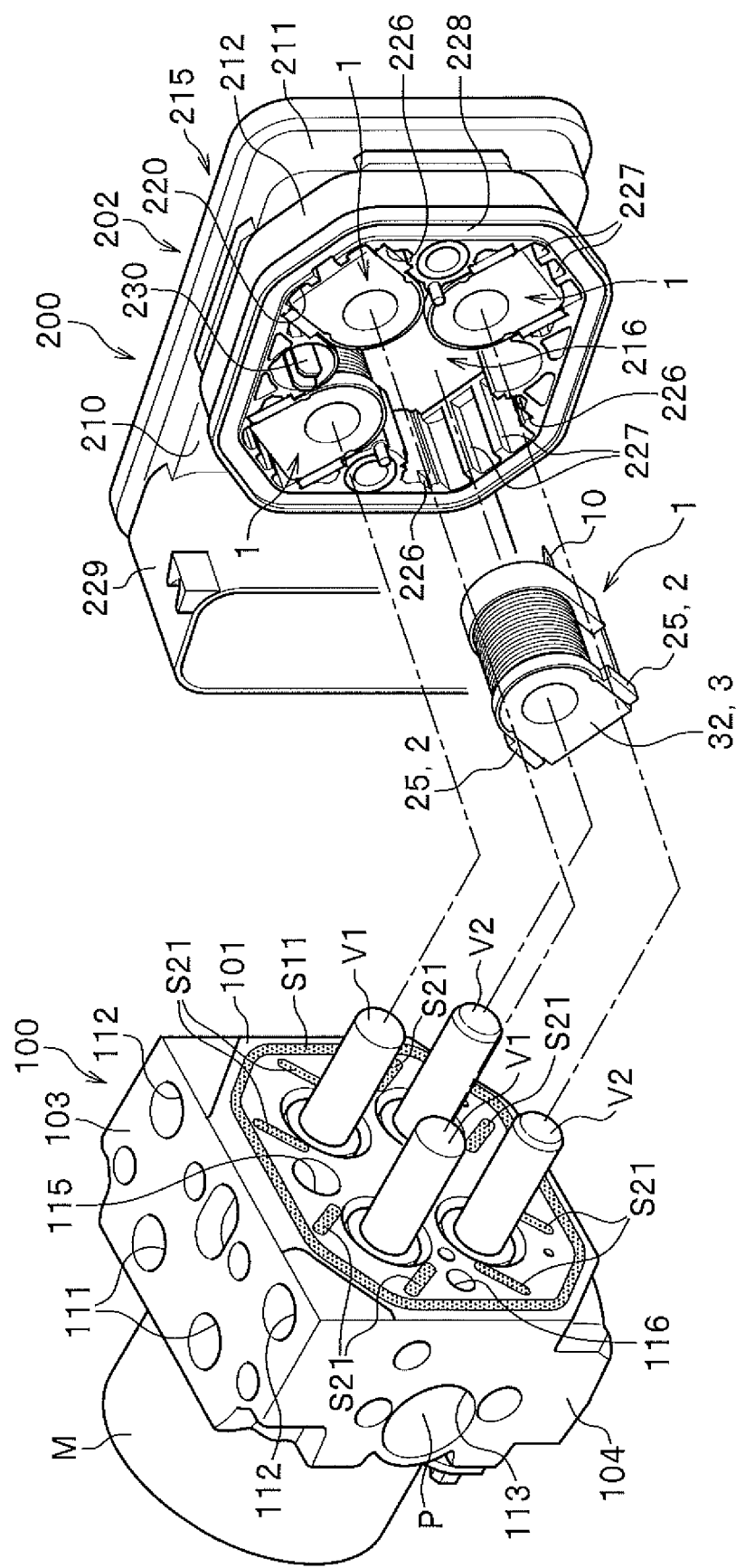
FIG. 2 is an exploded perspective view illustrating the brake fluid pressure control device for vehicles.

As seen in FIGS. 1 and 2, the brake fluid pressure control device U for vehicles includes a base body 100, with which solenoid valves V1, V2, a motor M, a reciprocating pump P and other components are fitted together in accordance with the two brake systems. The brake fluid pressure control device U for vehicles includes an electric control unit 200 as an example of an electric component assembly; the electric component assembly is equipped with a control board 201

(as an example of an electric component) configured to detect behaviors of a vehicle body and to control opening and closing of the solenoid valves V1, V2, and the operation of the motor M. Other than the solenoid valves V1, V2, various sensors such as pressure sensors and the like are fitted together with the base body 100.

Brake fluid passages (oil passages) not shown in the figures are formed within the base body 100. The brake fluid pressure control device U for vehicles is configured such that the control board 201 causes the solenoid valves V1, V2 and the motor M to operate in accordance with behaviors of the vehicle body to thereby change the brake fluid pressures within the brake fluid passages.

Configuration of Base Body

The base body 100 is a metallic component (see FIG. 2) having a substantially rectangular prism-shaped configuration, and brake fluid passages (oil passages) not shown in the figures are formed inside the base body 100.

Among respective sides of the base body 100, a front side 101 to be one side has a plurality holes such as attachment holes 110 for attachment of the solenoid valves V1, V2; each attachment hole 110 has a bottom. The number of solenoid valves V1, V2 used is arbitrary and may be changed, for example, in accordance with the type of the vehicle (e.g., the target vehicle is a four-wheeled vehicle) and the function of the brake fluid pressure control device U for vehicles. Coil assemblies 1 as electric components are attached to the solenoid valves V1, V2 according to this embodiment. The solenoid valve V1 is a normally open-type solenoid valve for instance. The solenoid valve V2 is a normally close-type solenoid valve for instance. As described later, each of the coil assemblies 1 is electrically connected to the control board 201 using press-fit terminals 10.

As seen in FIG. 2, an upper side 103 of the base body 100 has inlet ports 111 and outlet ports 112, to which piping extending to the wheel brakes (not shown) is connected.

A lower side of the base body 100 has reservoir holes, in which reservoir constituent parts (not shown) for constituting a reservoir are fitted.

Further, a lateral side 104 of the base body 100 has a pump hole 113 to which the reciprocating pump P is attached.

It should be noted that holes formed in the base body 100 are in communication with each other in a manner directly or through brake fluid passages (not shown) formed inside the base body 100.

Configuration of Motor

The motor M is an electrically operating component as a power source for the reciprocating pump P. The motor M is unitarily fixed to a rear side 102 of the base body 100 that is another side of the base body 100. The motor M drives the reciprocating pump P.

Motor bus bars (not shown) for supplying power to a rotor are connected to the motor M. The motor bus bars are inserted into a terminal hole 115 of the base body 100 (see FIG. 2), and are electrically connected to the control board 201 (see FIG. 1; the same applies hereinafter) through bus bar terminal portions 230 of the electric control unit 200 (see FIGS. 2 and 4). A press-fit terminal (not shown) is connected to the bus bar terminal portion 230 so as to protrude frontward. The motor bus bars connected to the bus bar terminal portions 230 are electrically connected to the control board 201 through the press-fit terminals.

Configuration of Electric Control Unit

The electric control unit 200 includes the coil assemblies 1, the control board 201, a housing 202, and a cover member 203. As described later, each of the coil assemblies 1 is fixed to the housing 202 by press-fitting. The housing 202 accommodates the coil assemblies 1 and the control board 201. The housing 202 also accommodates the solenoid valves V1, V2 protruding from the base body 100 and the motor bus bars (not shown). The structure for attaching the coil assembly 1 to the housing 202 will be described later in detail.

The control board 201 includes a substantially rectangular circuit board body on which an electric circuit is printed, and electric components such as semiconductor chips mounted on the circuit board. The control board 201 has a plurality of through-holes 201a, in which a pair of press-fit terminals 10 provided on each coil assembly 1 are press-fitted. The control board 201 performs control based on information obtained from sensors (not shown) and the like of the vehicle and previously stored programs. To be more specific, the control board 201 controls energization over the coil assemblies 1 (see FIG. 2) and the motor M to control opening and closing operations of the solenoid valves V1, V2 and the operation of the motor M. Various other sensors such as an angular velocity sensor and an acceleration sensor are used as the sensors.

Configuration of Housing

As seen in FIG. 1, the housing 202 is a box-like member configured to cover the solenoid valves V1, V2 protruding from the front side 101 of the base body 100 and to be fixed unitarily to the front side 101 of the base body 100. The housing 202 is integrally molded from a plastic material. The control board 201 and the coil assemblies 1 are fitted together with the housing 202.

The housing 202 opens at a rear side thereof that is a side facing to the base body 100 and at a front side thereof that is a side opposite from (facing away from) the base body 100.

As seen in FIG. 2, the housing 202 includes a board-like bottom portion 210, a first peripheral wall portion 211 provided on a front side of the bottom portion 210, and a second peripheral wall portion 212 provided on a rear side of the bottom portion 210.

The bottom portion 210 has a substantially rectangular profile. The first peripheral wall portion 211 extends frontward from a peripheral edge portion of the bottom portion 210 and is substantially rectangular in its outer peripheral profile. The first peripheral wall portion 211 forms a first receiving chamber 215 (see FIG. 1) for receiving therein the control board 201 having a generally rectangular shape.

The second peripheral wall portion 212 extends rearward from the rear side of the bottom portion 210 and is generally octagonal in its outer peripheral profile. The second peripheral wall portion 212 forms a second receiving chamber 216 (see FIG. 1) for receiving therein the coil assemblies 1.

As seen in FIGS. 1 and 3, the first receiving chamber 215 and the second receiving chamber 216 are in communication with each other. In other words, no partition wall exists between the first receiving chamber 215 and the second receiving chamber 216. With this configuration of the housing 202 having no partition wall, as seen in FIG. 1, the coil assemblies 1 are disposed to extend across the second receiving chamber 216 and the first receiving chamber 215. This makes it possible to reduce the size of the housing 202 in the front-rear direction while allowing installation of the coil assemblies 1 in a preferable manner.

Figure 8A:
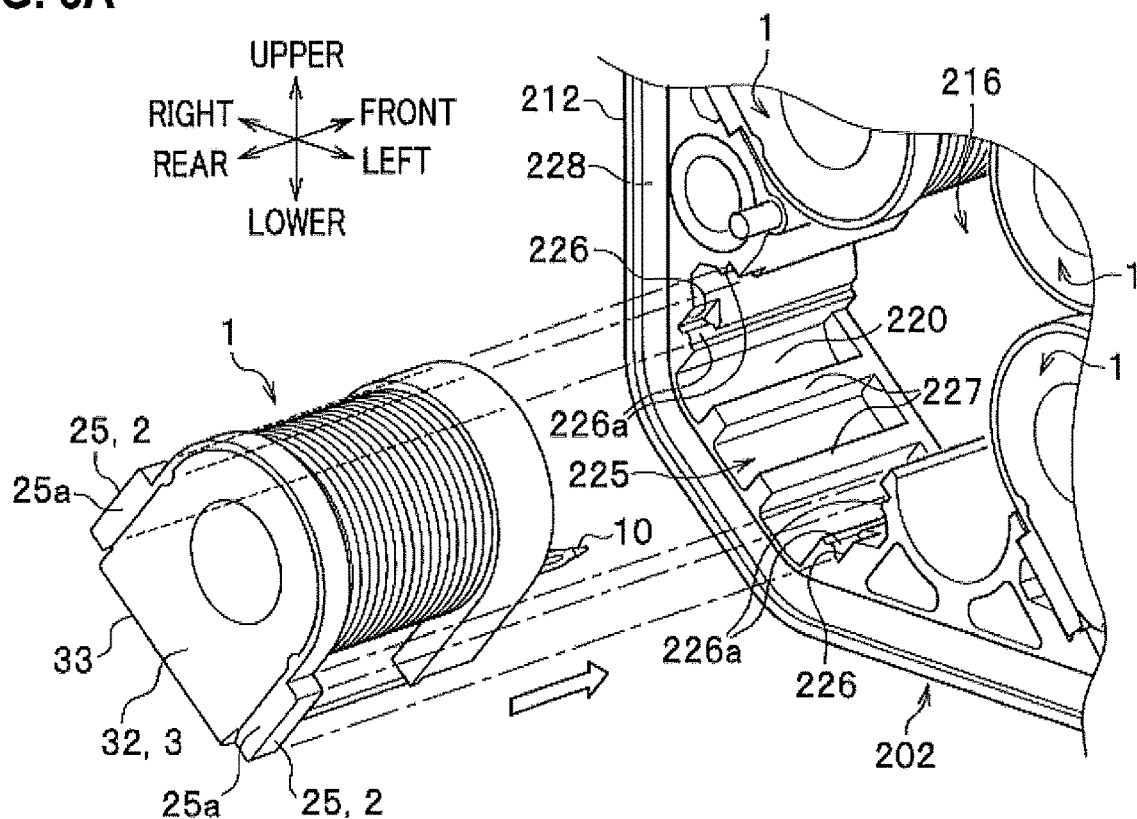

As seen in FIG. 4, a retaining wall 220 having a bumpy surface (with protrusions and recesses) is formed inside the second peripheral wall portion 212. The retaining wall 220 includes boss portions 221 disposed at right and left sides and protruding laterally inward of the second receiving chamber 216, a terminal boss portion 222 disposed at an upper side and protruding inward of the second receiving chamber 216, and a retaining portion 223 disposed at a lower side and protruding inward of the second receiving chamber 216. Four attachment spaces 225, in total, in which the corresponding coil assemblies 1 are attached, are formed inside the retaining wall 220, at positions respectively between the terminal boss portion 222 and the adjacent boss portions 221, and at positions respectively between the retaining portion 223 and the adjacent boss portions 221. The retaining wall 220 has the same inner shape at the respective attachment spaces 225; this inner shape follows the outer shape of the coil assembly 1. In an open edge portion of each of the attachment spaces 225, a pair of groove portions 226 are provided, by which the coil assembly 1 is positioned and fixed within the attachment space 225. In each of the attachment space 225, the groove portions 226 are formed on the positions opposite to the oppositely arranged retaining wall 220. As seen in FIG. 8A, projections 226a are formed on the inner surface of each groove portion 226; the projections 226a are configured to give a press-fit effect upon assembly of the coil assembly 1. The projections 226a protrude inward toward the inner side of the groove portion 226. As will be described later, the projections 226a contact ribs 25 to be inserted into the groove portions 226 (see FIG. 8B). As seen in FIG. 2, reinforcement ribs 227 are formed on the inner surface of the retaining wall 220.

A peripheral groove 228 is formed at a rear end portion of the second peripheral wall portion 212. Adhesive for fixing to the front side 101 of the base body 100 is present in the peripheral groove 228. The housing 202 forms an air-tight seal with the front side 101 of the base body 100 using adhesive. An annular-shaped hatched area shown in FIG. 2 by a hatching line S11 and located at the front side 101 of the base body 100 (see FIG. 10), and linear hatched areas shown by hatching lines S21 and located at positions sandwiching the solenoid valves V1, V2 and corresponding to the ribs 25 (see FIG. 10) contact the peripheral groove 228 and the ribs 25 with adhesive being present therebetween. Application of adhesive on the annular-shaped hatching line S11 and application of adhesive on the linear hatching lines S21 are carried out in the same process.

Figure 10:
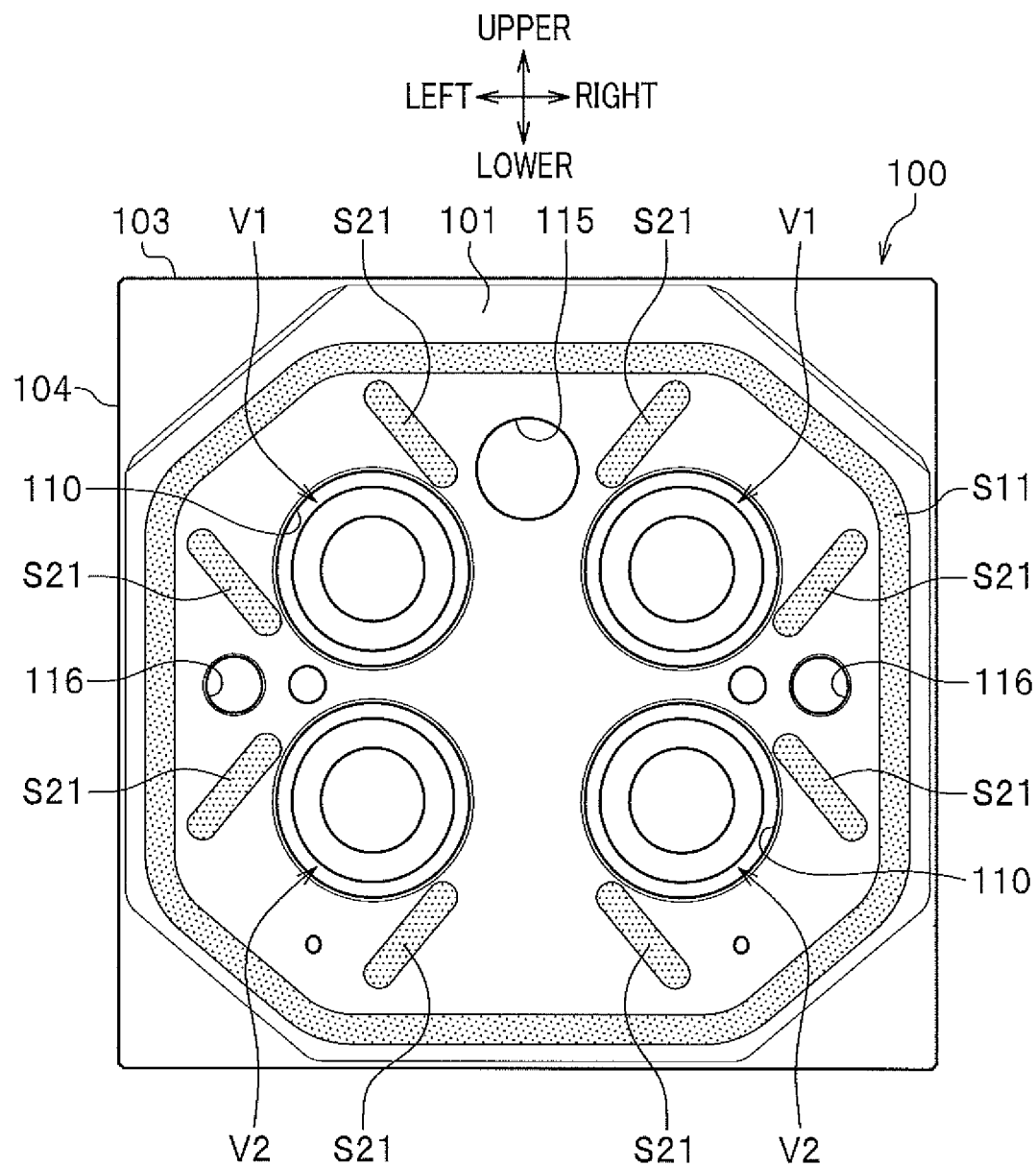
FIG. 10 is a front view illustrating a bonding area of a base body adapted to the brake fluid pressure control device for vehicles according to the first embodiment.

The housing 202 is mounted to the base body 100 by inserting fastening screws (not shown) through the boss portions 221 of the retaining wall 220 of the second receiving chamber 216 and screwing the fastening screws into screw holes 116 of the base body 100 (see FIG. 2 and FIG. 10).

The cover member 203 is a plastic cover member configured to seal an opening formed at the front side of the housing 202 that is the side opposite from the base body 100. The cover member 203 is fixed to the front end surface of the housing 202 by welding, bonding, fastening by screws, or other suitable means.

Configuration of Coil Assembly

Figure 5A:
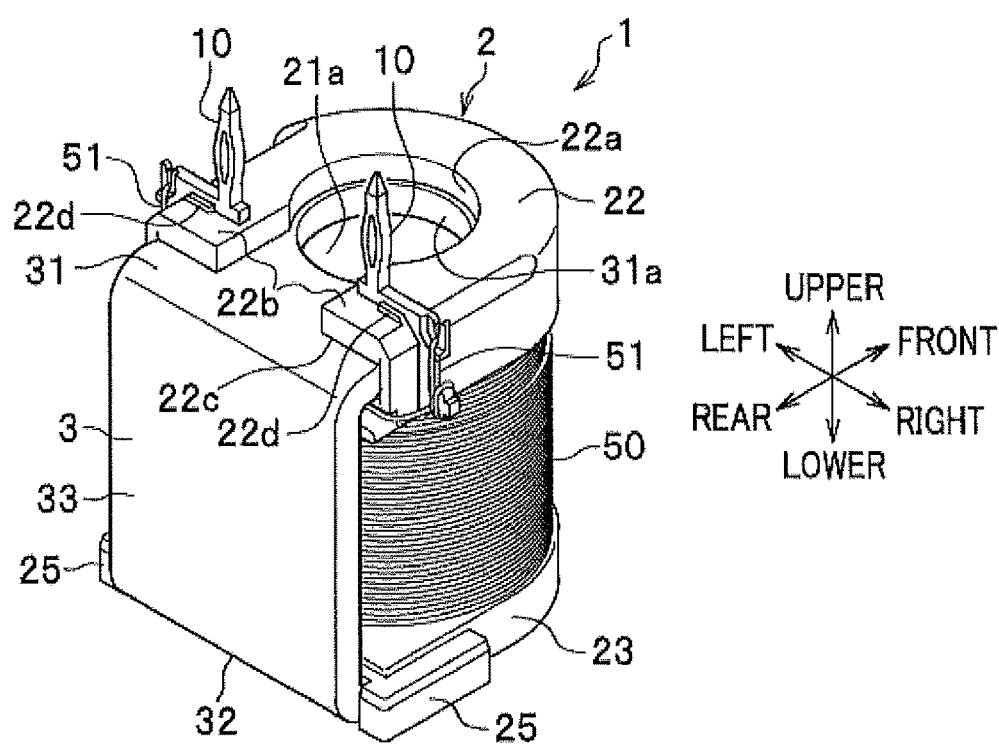

As seen in FIGS. 5A and 6 respectively, the coil assembly 1 includes a bobbin 2, a coil 50, a yoke 3, and press-fit terminals 10 as connecting terminals. As seen in FIG. 1, the coil assembly 1 is an electric component received in the housing 202 while surrounding the solenoid valve V1, V2. The coil assembly 1 is a magnet coil configured to produce a magnetic field around the solenoid valve V1, V2 when electricity runs from the control board 201 to the coil 50 via the pair of press-fit terminals 10. As will be described later, the coil assembly 1 is fixed to the front side 101 of the base body 100 through adhesive.

Configuration of Bobbin

As seen in FIG. 6D, the bobbin 2 is a plastic component (i.e., insulating component) including a cylindrical portion 21, and flange portions 22, 23 formed on an upper end portion and a lower end portion of the cylindrical portion 21. The cylindrical portion 21 has a circular insertion hole 21a as a bobbin-side insertion hole; the insertion hole 21a extends through the cylindrical portion 21 at a center portion of the cylindrical portion 21. The insertion hole 21a is in communication with an upper yoke receiving portion 22c formed in the upper flange portion 22 and a hole portion 22a of the upper flange portion 22. The insertion hole 21a is also in communication with a lower yoke receiving portion 23a formed in the lower flange portion 23. The insertion hole 21a has an inner diameter D1. As seen in FIGS. 6A and 6E, each of the flange portions 22, 23 has a front portion and a rear portion; the front portion is formed to have a semi-circular shape as viewed from above in accordance with the winding shape of the coil 50, and the rear portion is formed to have a generally rectangular shape as viewed from above in accordance with the shape of the yoke. The inner diameter of the opening portion 22a of the flange portion 22 is larger than the inner diameter D1 of the insertion hole 21a.

As seen in FIG. 6D, the upper flange portion 22 has a thickness in the upper-lower direction that is thicker than the lower flange portion 23. The upper yoke receiving portion 22c, in which an upper portion 31 of the yoke 3 can be received, is formed inside the upper flange portion 22. The upper yoke receiving portion 22c opens at the rear side and the front side of the upper flange portion 22. The upper portion 31 of the yoke 3 is received in the upper yoke receiving portion 22c from the rear side of the upper flange portion 22.

The upper yoke receiving portion 22c has a predetermined clearance in a direction orthogonal to the axial direction of the bobbin 2 (i.e., in the horizontal direction), relative to the upper portion 31 of the yoke 3 that is received in the upper yoke receiving portion 22c. This makes it possible to allow the upper portion 31 of the yoke 3 to move in the horizontal direction within the upper yoke receiving portion 22c due to the clearance.

The flange portion 22 is excellent in insulating property because the flange portion 22 generally entirely covers the upper portion 31 of the yoke 3.

As seen in FIG. 6C, two projections 22e, 22e (only one projection is shown in the drawing) are formed on a rear end edge portion of the upper flange portion 22; the two projections 22e, 22e are disposed spaced apart in the right-left direction by a predetermined distance. The projection 22e is a board-like portion protruding rearward from the rear end edge portion of the upper flange portion 22; the projection 22e has a rectangular configuration as viewed from above.

Figure 5B:
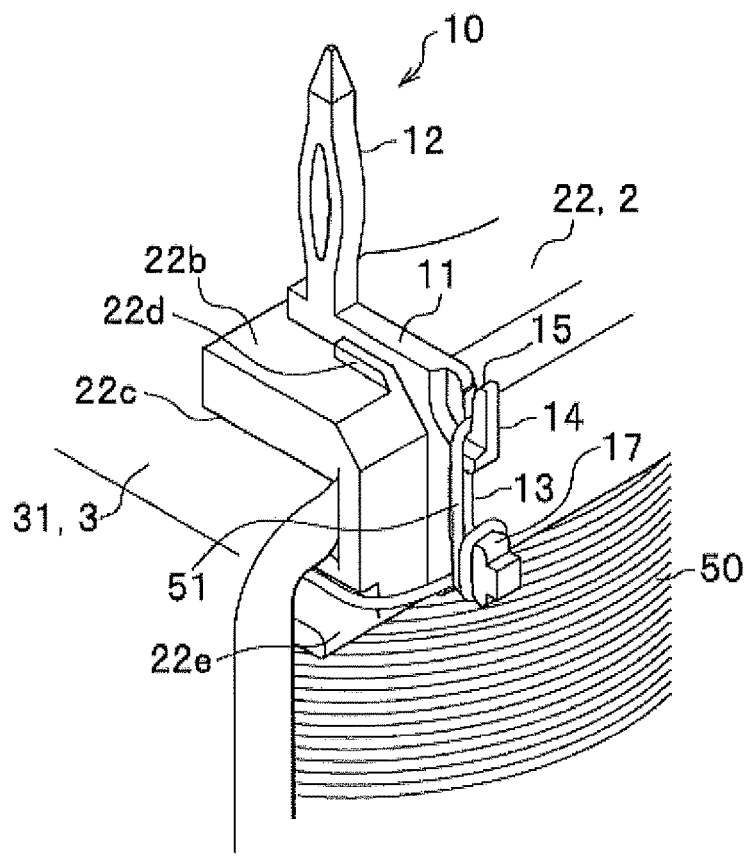

As seen in FIGS. 5A and 5B, terminal supporting portions 22b, 22b configured to support base portions 11, 11 of the two press-fit terminals 10, 10 are formed at a rear right portion and a rear left portion of the upper flange 22. A portion of the press-fit terminal 10 is embedded in the terminal supporting portion 22b by insertion molding. In other words, the terminal supporting portions 22b, 22b (upper flange portion 22) serve as insulators for the press-fit terminals 10, 10.

Disposed under the terminal supporting portions 22b, 22b is the upper portion 31 of the yoke 3 that is received in the upper yoke receiving portion 22c. In other words, the two press-fit terminals 10, 10 are supported by the upper portion 31 of the yoke 3 through the terminal supporting portions 22b, 22b. On the other hand, the terminal supporting portions 22b, 22b cover those portions of the upper portion 31 of the yoke 3 which support the press-fit terminals 10, 10. Accordingly, insulation between the press-fit terminals 10, 10 and the yoke 3 can be made.

As seen in FIG. 6D, the lower yoke receiving portion 23a, in which a lower portion 32 of the yoke 3 can be received, is formed inside the lower flange portion 23. The lower yoke receiving portion 23a opens at the rear side and the lower side of the lower flange portion 23. In other words, the lower portion 32 of the yoke 3 is exposed to the lower side of the coil assembly 1 (see FIG. 6E). The lower portion 32 of the yoke 3 is received in the lower yoke receiving portion 23a from the rear side of the lower flange portion 23.

As seen in FIG. 6E, curved protruding portions 23b, 23b are formed on right and left opposing portions of the inner surface of the lower yoke receiving portion 23a; the protruding portions 23b, 23b protrude inward. As with the upper yoke receiving portion 22c as described above, the lower yoke receiving portion 23a has a predetermined clearance in a direction orthogonal to the axial direction of the bobbin 2 (i.e., in the horizontal direction), relative to the lower portion 32 of the yoke 3 that is received in the lower yoke receiving portion 23a. This makes it possible to allow the lower portion 32 of the yoke 3 to move in the horizontal direction within the lower yoke receiving portion 23a due to the clearance.

Quadrangular prism-shaped ribs 25, 25 are formed on a right side surface and a left side surface of the rear portion of the lower flange portion 23 (i.e., at portions of the outer surface of the coil assembly 1 in a direction intersecting the fitting direction). The ribs 25, 25 serve as portions configured to be fitted (positioned) when the coil assembly 1 is fitted together with the second receiving chamber 216 of the housing 202 (see FIG. 3). To be more specific, as seen in FIGS. 2 and 3, the ribs 25, 25 are press-fitted into the groove portions 226 provided in the attachment space 225 of the second receiving chamber 216. By this press-fitting, movement of the coil assembly 1 in a direction intersecting the fitting direction (direction shown by the arrow in FIG. 8A; axial direction of the coil assembly 1) as well as rotation of the coil assembly 1 around an axis parallel to the fitting direction are restrained.

Figure 8B:
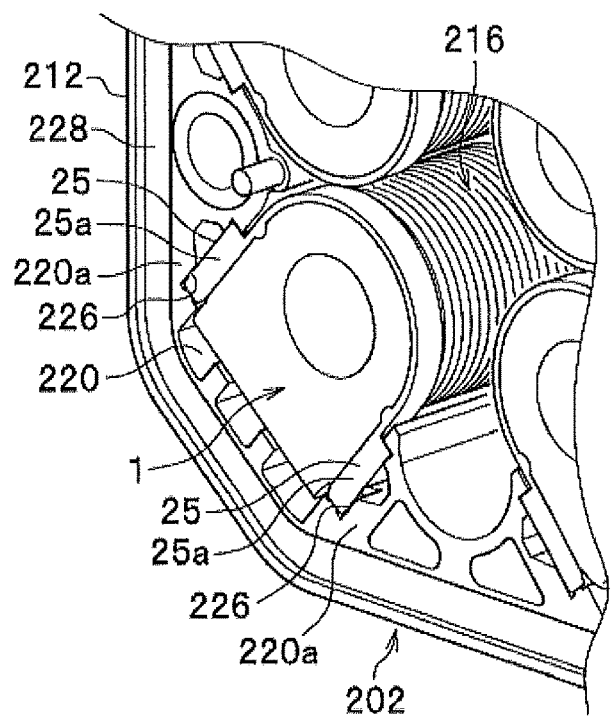
Figure 9:
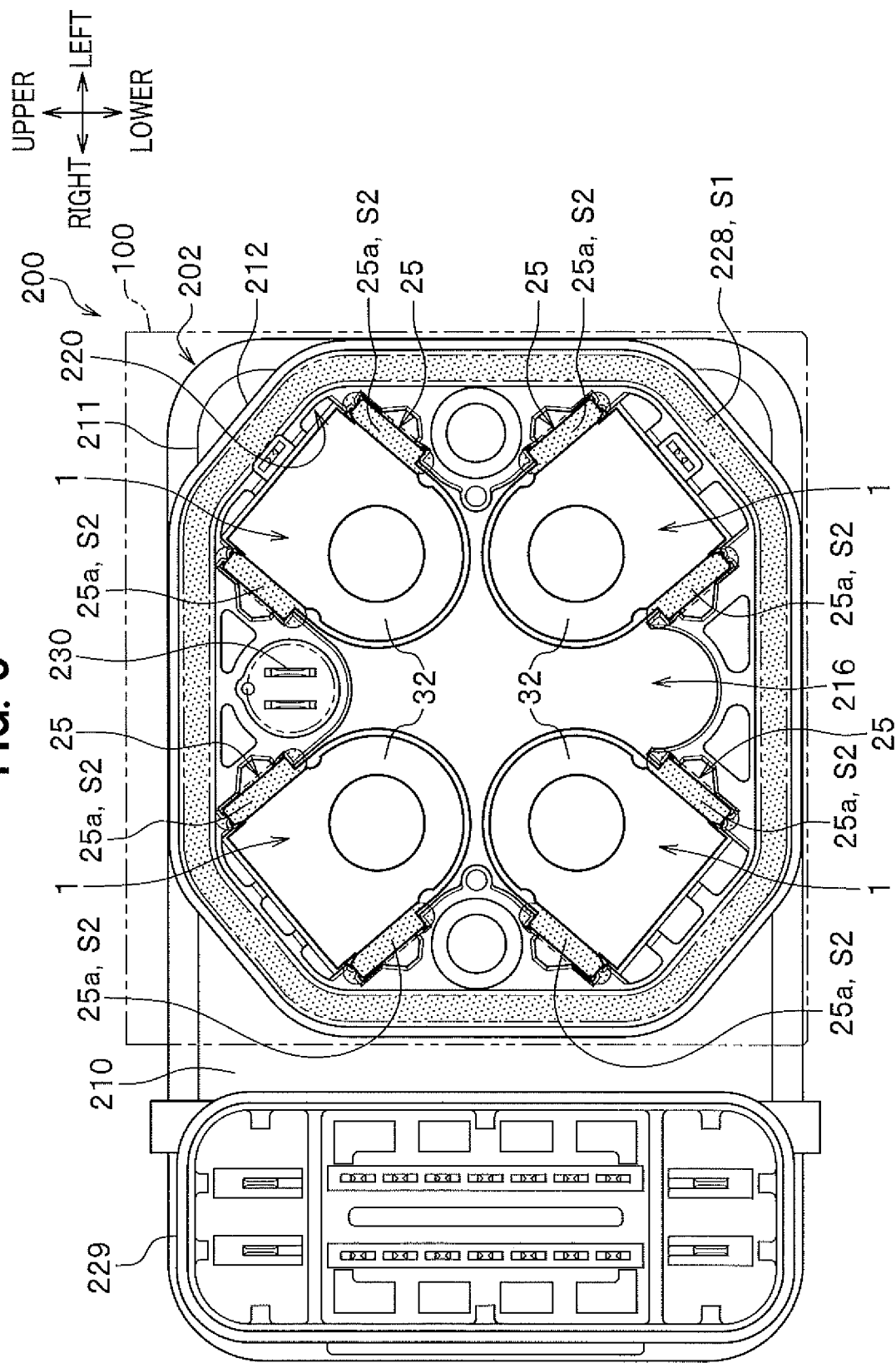
FIG. 9 is a rear view illustrating a housing bonding margin and electric component bonding margins of the electric component assembly according to the first embodiment.

Meanwhile, the ribs 25, 25 also serve as electric component bonding margins S2 for bonding the coil assembly 1 to the front side 101 of the base body 100 with adhesive (see FIG. 9). To be more specific, as seen in FIG. 8B, a lower surface 25a of each rib 25 lies flush with a rear surface 220a of the retaining wall 220 with the rib 25 being press-fitted into the groove portion 226. Accordingly, the lower surface 25a of the rib 25 is contactable with the front side 101 of the base body 100, and serves as the electric component bonding margin S2 for bonding the coil assembly 1 with adhesive.

As an alternative, for example, middle wall portions (not shown) may be provided inside the housing 202, and the ribs 25, 25 are press-fitted into groove portions provided on the middle wall portions.

Application of the adhesive is not limited to the presence only on the lower surface 25a of the rib 25; the adhesive may be present on the ribs 25, 25 and the lower surface of the lower portion 32 of the yoke 3. The adhesive may also be present partly on the lower surface 25a of the rib 25. As long as the coil assembly 1 is fixed to the front surface 101 of the base body 100, the adhesive may be applied on an arbitrary portion.

The bobbin 2 configured as described above may be produced, for example, by injection molding. While the bobbin 2 is injection molded, the press-fit terminals 10, 10 are integrally connected to the flange portion 22 by insert molding.

Configuration of Yoke

The yoke 3 is a member configured to be mounted to the bobbin 2; the yoke 3 is made of a metallic material exhibiting magnet properties. As seen in FIGS. 5A and 6D, the yoke 3 consists of an upper portion 31, a lower portion 32, and a side portion 33 connecting the upper portion 31 and the lower portion 32. The yoke 3 is formed to have a generally recess-shaped vertical section (see FIG. 6D).

The upper portion 31 is a portion received in the upper yoke receiving portion 22c of the upper flange portion 22 of the bobbin 2. The upper portion 31 has a profile same as that of the upper flange portion 22 of the bobbin 2; a front portion of the upper portion 31 has a semi-circular shape, and a rear portion of the upper portion 31 has a generally rectangular shape. The upper portion 31 is received in the upper yoke receiving portion 22c with the above-described clearance, and movable in the horizontal direction relative to the upper yoke receiving portion 22c.

The upper portion 31 has a profile same as but smaller than that of the lower portion 32, for the purpose of distinguishing between the upper side and the lower side with ease during the assembling operation.

The upper portion 31 is received in the upper yoke receiving portion 22c and thereby disposed under the press-fit terminals 10 through the upper flange portion 22. In other words, the upper portion 31 supports each press-fit terminal 10 (terminal portion 12; and base portion 11) in an axial extension of the terminal portion 12.

The lower portion 32 is a portion received in the lower yoke receiving portion 23a of the lower flange portion 22 of the bobbin 2 (see FIG. 6D). As with the profile of the upper portion 31, a front portion of the lower portion 32 has a semi-circular shape, and a rear portion of the lower portion 32 has a generally rectangular shape.

As seen in FIG. 6E, the lower portion 32 has recess portions 32b, 32b at positions opposite to the protruding portions 23b, 23b of the lower yoke receiving portion 23a. When the lower portion 32 is received in the lower yoke receiving portion 23a, the protruding portions 23b, 23b of the lower yoke receiving portion 23a are loosely fitted into the recess portions 32b, 32b of the lower portion 32 (with a gap therebetween). The lower portion 32 is received in the lower yoke receiving portion 23a with a clearance. As described above, the lower portion 32 is movable in the horizontal direction relative to the lower yoke receiving portion 23a while the protruding portions 23b, 23b are loosely fitted into the recess portions 32b, 32b. In other words, the protruding portions 23b, 23b are fitted into the recess portions 32b, 32b so as to allow movement of the lower portion 32 in the horizontal direction.

As seen in FIG. 6D, the yoke 3 has a circular insertion hole 31a formed in the upper portion 31, and a circular insertion hole 32a formed in the lower portion 32; the insertion holes 31a, 32a are an example of yoke-side fitting holes. These insertion holes 31a, 32a have the same inner diameter D2. The inner diameter D2 is sized to be fitted onto the solenoid valve V1 (V2). The relationship between the inner diameter D1 of the insertion hole 21a of the bobbin 2 and the inner diameter D2 of the insertion holes 31a, 32a of the yoke 3 are set such that the inner diameter D1 on the bobbin 2 side is larger and the inner diameter D2 on the yoke 3 side is smaller to satisfy the inner diameter D1>the inner diameter D2.

Configuration of Press-Fit Terminals

As seen in FIG. 5B, each of the two press-fit terminals 10, 10 is a metallic component, a part of which is insert molded in the terminal supporting portion 22b (bobbin 2). As seen in FIG. 5A, the two press-fit terminals 10, 10 are disposed spaced apart from each other with a predetermined distance in the right-left direction. Respective end portions of the winding 51 are electrically connected to the two press-fit terminals 10, 10.

As seen in FIG. 7, each press-fit terminal 10 includes a board-like base portion 11, a terminal portion 12 protruding upward from an upper side end portion of the base portion 11, and a connecting portion 13 protruding downward from a lower side end portion of the base portion 11; the upper side end portion is located at one end portion of the base portion 11, while the lower side end portion is located at the other end portion of the base portion 11.

Figure 7A:
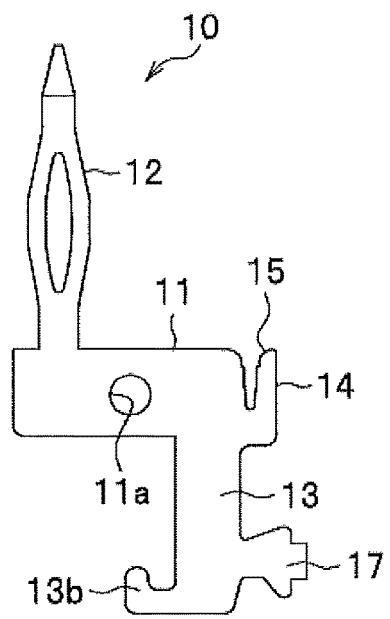

As seen in FIG. 5B, a major portion of the base portion 11 is embedded in the terminal supporting portion 22b. An upper portion of the base portion 11 is exposed from the terminal supporting portion 22b. As seen in FIG. 7A, the base portion 11 has an insertion hole 11a, into which plastic resin flows upon molding. As seen in FIG. 5B, the base portion 11 is reinforced and supported by a reinforcement rib 22d provided on the terminal supporting portion 22b.

The terminal portion 12 protrudes perpendicularly upward from the upper side end portion of the base portion 11 (toward the axially outer side of the bobbin 2). In other words, the terminal portion 12 extends upward above the upper flange portion 22. The terminal portion 12 has a front end portion that bulges annularly. The front end portion of the terminal portion 12 is press-fitted in the through-hole 201a (see FIG. 1) of the control board 201 (see FIG. 1).

The connecting portion 13 is a portion to which the winding 51 of the coil 50 is connected. In the connecting portion 13, a contacting portion 14 with which the winding 51 contacts has a thickness thinner than the remaining portions of the connecting portion 13. To be more specific, because the press-fit terminal 10 is susceptible to the thickness thereof due to frictional contact, the connecting portion 13, to which the winding 51 is connected, is made thinner, so that the coating of the winding 51 is scraped off by the contact.

Figure 7B:
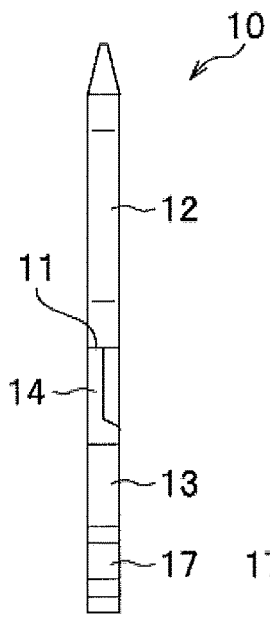
Figure 7C:
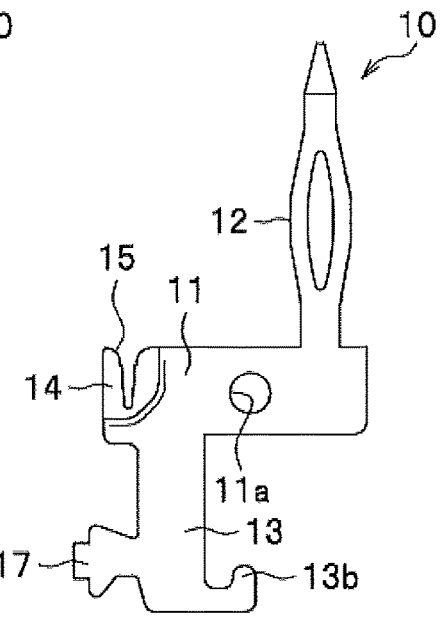
Figure 7D:
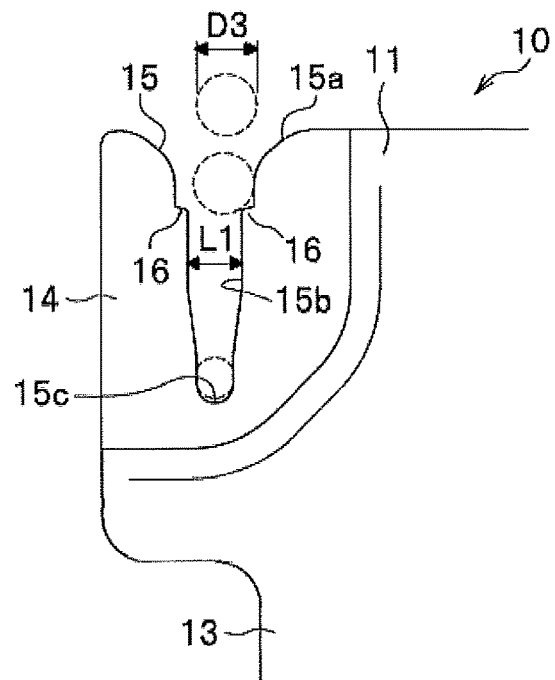

As seen in FIG. 7D, the contacting portion 14 has a groove 15 in the shape of a generally V-shaped cross section. An upper edge portion of the groove 15 extends laterally outward to form rounded-corner portions. A pair of step portions 16, 16 that protrude inward toward the groove 15 are formed on opposite portions of the inner surface of the groove 15. The groove 15b is narrower in width at the step portions 16, 16. The width L1 of the groove 15b (i.e., width in the right-left direction) at the step portions 16, 16 of the groove 15 is set to be smaller than the diameter D3 of the winding 51 (diameter of the winding 51 with the coating). The groove 15 becomes narrower toward the lowermost portion 15c.

As seen in FIGS. 7A and 7C, a projection portion 17 is formed on a lower side portion of the connecting portion 13; a wire is wound around between the groove 15 and the projection portion 17 to provide the winding 51. A hook portion 13b having a hook-shape and protruding toward the terminal supporting portion 22b (see FIG. 5B) is formed on a lower end portion of the connecting portion 13. Although not shown in the figures, the hook portion 13b is embedded in the terminal supporting portion 22b (see FIG. 5B).

The press-fit terminal 10 is produced, for example, by press working (press working stamping). The contacting portion 14 having a reduced thickness is formed by press working stamping followed by press working, to thereby provide a thin portion. After that, the groove 15 is stamped out. It should be noted that the contacting portion 14 may be formed by press working simultaneously with press working stamping, or alternatively, the contacting portion 14 may be formed by press working followed by press working stamping.

Configuration of Coil

As seen in FIG. 5A, the coil 50 includes a winding 51 around the cylindrical portion 21 of the bobbin 2. The two end portions of the winding 51 are respectively wound around the connecting portions 13, 13 of the press-fit terminals 10, 10, so that the coil 50 and each of the press-fit terminals 10, 10 are electrically connected.

Fitting of Coil Assembly Together with Housing

As seen in FIG. 8A, the coil assembly 1 is fitted in the housing 202 from the rear side of the second receiving chamber 216. At this time, the coil assembly 1 is inserted into the attachment space 225 with the press-fit terminals 10, 10 being directed toward the attachment space 225 and with the side portion 33 of the yoke 3 being directed toward the reinforcement ribs 227 in the attachment space 225. It should be noted that the press-fit terminal 10 is shown in simplified form in FIG. 8A.

As shown by the arrow of FIG. 8A, when the coil assembly 1 is inserted in the fitting direction, the ribs 25, 25 of the flange portion 23 of the bobbin 2 are brought into contact with the open edge formed by the groove portions 226 in the attachment space 225. The coil assembly 1 is pushed in the fitting direction, while retaining the posture thereof, so that the ribs 25, 25 enter the groove portions 226 to complete press-fitting.

By this press-fitting, the coil assembly 1 is positioned in a predetermined position of the second receiving chamber 216 and fixed to the housing 202.

Fitting of Housing Together with Base Body

After each of the coil assemblies 1 are fitted together with the housing 202, adhesive is applied to the areas shown by the annular-shaped hatching line S11 and the linear hatching lines S21; the annular-shaped hatching line S11 corresponds to the housing bonding margin S1 located on the front side 101 of the base body 100 at a position associated with the peripheral groove 228 of the housing 202, and the linear hatching lines S21 correspond to the electric component bonding margins S2 for the lower surfaces 25 of the ribs 25 of the coil assemblies 1. Thereafter, the housing 202 is moved toward to the front side 101 of the base body 100, during which the coil assemblies 1 are attached to the solenoid valves V1, V2 protruding at the front side 101, and then the rear end of the housing 202 is brought into contact with the front side 101 of the base body 100. Accordingly, the housing 202 and the coil assemblies 1 are bonded to the front side 101 of the base body 100 through the adhesive present between the base body 100 and the housing bonding margin S1 and the electric component boding margins S2. Fastening screws (not shown) inserted into the boss portions 221 on the retaining wall 220 of the second receiving chamber 216 are screwed into the corresponding screw holes 116 of the base body 100 (see FIG. 2). The housing 202 and the coil assemblies 1 are thereby fixed to the front side 101 of the base body 100.

The insertion hole 21a of the bobbin 2 has the inner diameter D1 larger than the inner diameter D2 of the insertion holes 31a, 32a of the yoke 3. Therefore, when the coil assemblies 1 are attached to the solenoid valves V1, V2, the yoke 3 is allowed to move (to move in a direction orthogonal to the axial direction) relative to the bobbin 2 fixed to the housing 202. Accordingly, even if a slight relative positional shift occurs between each of the solenoid valves V1, V2 and the corresponding coil assembly 1, this positional shift is absorbed and the coil assemblies 1 can be attached to the solenoid valves V1, V2. The positional shift from the solenoid valve V1, V2 can be absorbed to allow the attachment of the coil assembly 1, while the press-fit terminals 10 are positioned in predetermined positions.

Fitting of Control Board Together with Housing

After the housing 202 is fitted together with the base body 100, the control board 201 is fitted together through an opening of the first receiving chamber 215 that opens at the front side of the housing 202. When assembling, the through-holes 201a of the control board 201 are positioned to the corresponding tip end portions of the press-fit terminals 10, and then the control board 201 is pushed toward the coil assemblies 1. The terminal portion 12 of each press-fit terminal 10 is press-fitted in the through-hole 201a. During this time, the press-fit terminal 10 is retained by the terminal supporting portion 22b of the coil assembly 1 and keeps an upright posture on the terminal supporting portion 22b. Accordingly, the terminal portion 12 of the press-fit terminal 10 is press-fitted in the through-hole 201a without failure.

After that, the cover member 203 is secured to the front end portion of the first receiving chamber 215 in liquid-tight manner using adhesive or other means.

According to this embodiment as described above, each of the coil assemblies 1 can be fixed to the housing 202 by the ribs 25 press-fitted into the groove portions 22b, while restraining the direction intersecting the fitting direction and the rotation around an axis parallel to the fitting direction. This makes it possible to fix the coil assembly 1 to a predetermined position of the housing 202 without using an assembling jib or other means. Accordingly, the press-fit terminals 10 can be disposed in predetermined positions of the housing 202 with great precision, and the connecting terminals can be connected to the control board 201 with ease without using an assembling jig and other means. This eliminates the need to provide a space for installing the jig which would be required in the conventional device upon connection of the connecting terminal, and thus the size reduction corresponding to this installation space can be attained. Further, it is not necessary to provide the coil assembly 1 with an attachment portion to which the jig is attached, so that the configuration of the coil assembly 1 can be simplified.

Further, since the connecting terminals are press-fit terminals 10, the press-fit terminals 10 and the control board 201 are electrically connected with ease, thereby improving assembly thereof.

Further, in the brake fluid pressure control device U for vehicles according to the present invention, the size of the electric control unit 200 can be reduced and the configuration of the coil assembly 1 can be simplified, so that miniaturization of the overall device and cost-reduction can be attained. Further, since the overall device can be miniaturized, the fitting operation of the device relative to a vehicle can be improved as well.

Second Embodiment

Next, a brake fluid pressure control device for vehicles, to which an electric component assembly according to the second embodiment is adapted, will be described. In this embodiment, an exemplified configuration will be described, in which the electric component assembly is adapted to a brake fluid pressure control device for two-wheeled vehicles equipped with one brake system. Of course, the electric component assembly may be adapted to a brake fluid pressure control device for two-wheeled vehicles equipped with two brake systems or to a brake fluid pressure control device for four-wheeled vehicles. Parts similar to those previously described in the first embodiment are denoted by the same reference numerals, and detailed description thereof will be omitted.

Figure 11:
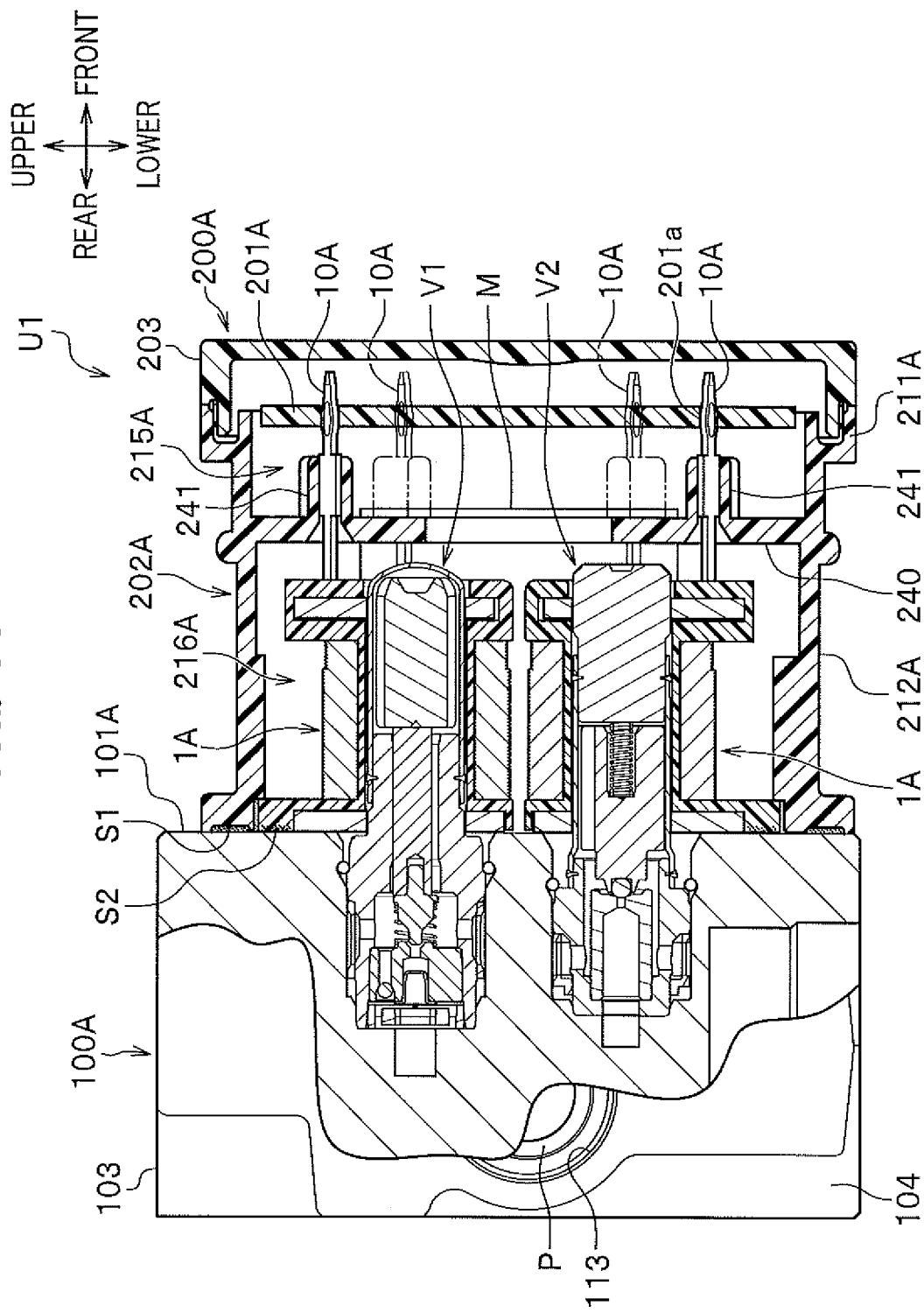
FIG. 11 is a side sectional view illustrating the brake fluid pressure control device for vehicles, which is equipped with an electric component assembly according to a second embodiment of the present invention.
Figure 12:
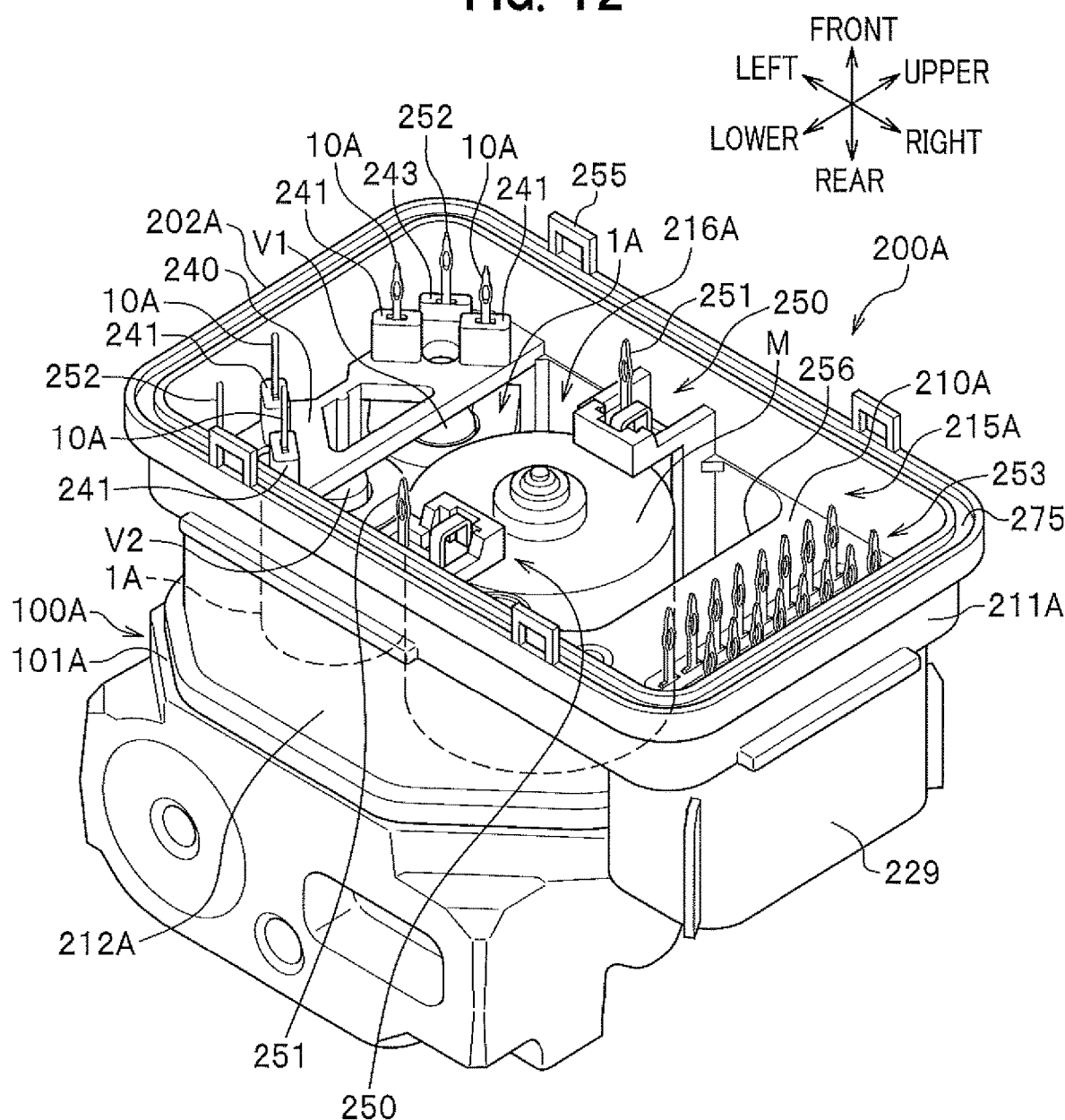
FIG. 12 is a perspective view illustrating components laid out in the housing of the brake fluid pressure control device for vehicles.

As seen in FIGS. 11 and 12, a brake fluid pressure control device U1 for vehicles according to this embodiment is configured such that the solenoid valves V1, V2 and the motor M are received in a housing 202A of an electric control unit 200A as an example of an electric component assembly.

The brake fluid pressure control device U1 for vehicles includes a base body 100A, with which the solenoid valves V1, V2, the motor M, the reciprocating pump P and other components are fitted together in accordance with the one brake system.

Configuration of Base Body

The base body 100A is a metallic component (see FIGS. 12 and 13) having a substantially rectangular prism-shaped configuration, and brake fluid passages (oil passages) not shown in the figures are formed inside the base body 100A.

Figure 13:
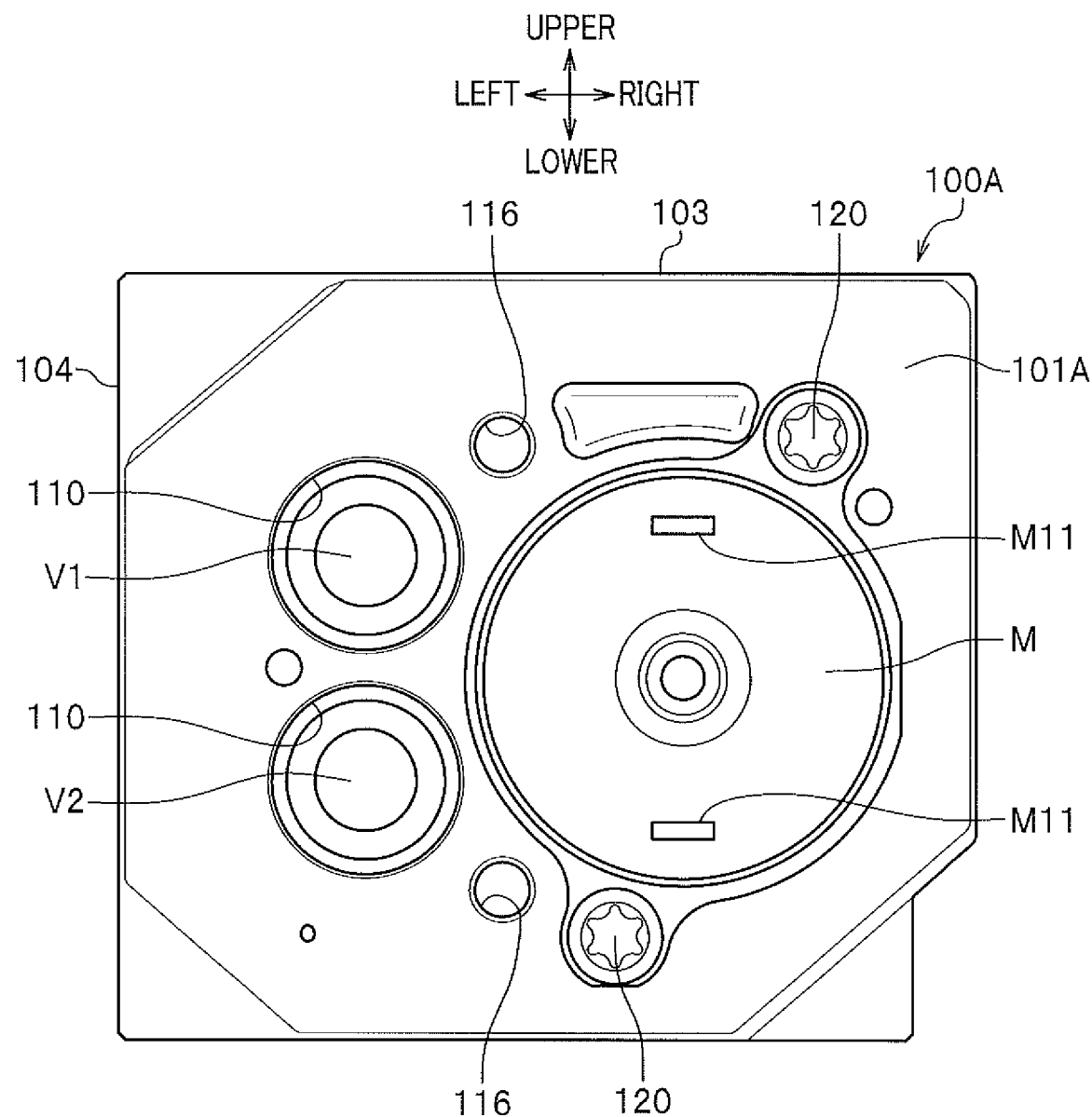
FIG. 13 is a front view illustrating a base body adapted to the brake fluid pressure control device for vehicles (i.e., view illustrating a mounting surface on which the electric component assembly is mounted).
Figure 14:
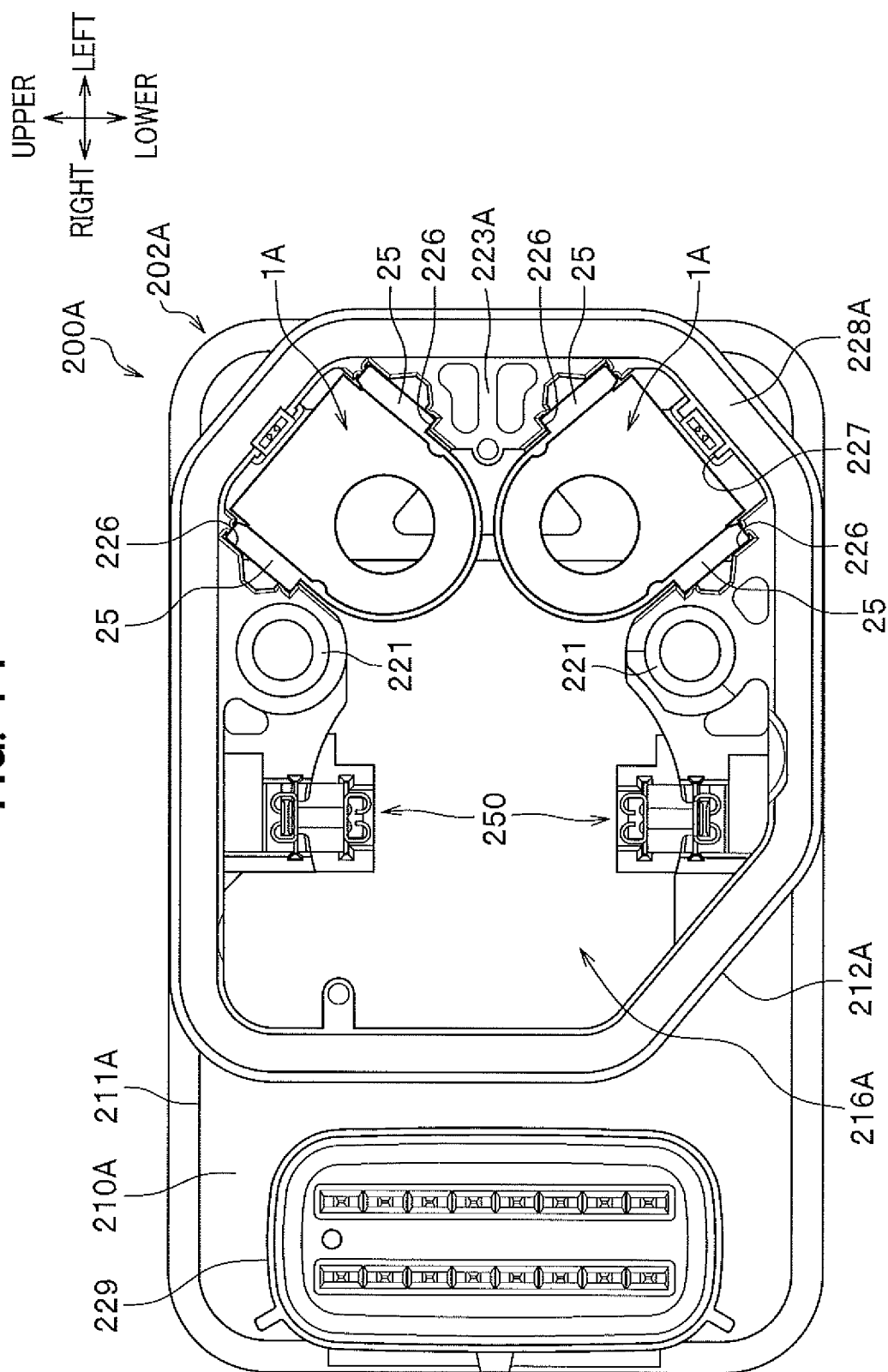
FIG. 14 is a rear view illustrating the electric component assembly according to the second embodiment.

As seen in FIG. 13, among respective sides of the base body 100A, a front side 101A to be one side has a plurality holes such as the attachment holes 110 for attachment of the solenoid valves V1, V2, and an attachment hole (not shown) for attachment of the motor M; each of the attachment holes 110 and the attachment hole has a bottom. In other words, the attachment holes for the solenoid valves V1, V2 and the attachment hole for the motor M are collectively formed in the front side 101A of the base body 100A. The coil assemblies 1 as electric components are attached to the solenoid valves V1, V2. As described later, each of the coil assemblies 1 is electrically connected to a control board 201A (see FIG. 11; the same applies hereinafter) using press-fit terminals 10A.

Configuration of Motor

The motor M is unitarily fixed to the front side 101A of the base body 100A by bolts 120 (see FIG. 21). The motor bus bars M11 (see FIGS. 13 and 21) are provided in pair at a bottom portion of a cover for the motor M. As seen in FIG. 12, the motor bus bars M11 are connected to bus bar terminal portions 250 provided on the inner wall of the housing 202A (first receiving chamber 215A). Each bus bar terminal portion 250 includes a press-fit terminal 251 that protrudes for connection to the control board 201A.

Configuration of Electric Control Unit

The electric control unit 200A includes the coil assemblies 1A, the control board 201A, a housing 202A, and a cover member 203. As with the first embodiment, the coil assemblies 1A are fixed to the housing 202A by press-fitting. The housing 202A accommodates the coil assemblies 1A and the control board 201A. The housing 202A also accommodates the solenoid valves V1, V2 protruding from the base body 100A and the motor M.

The control board 201A controls energization over the coil assembles 1A and the motor M to control opening and closing operations of the solenoid valves V1, V2 and the operation of the motor M.

Configuration of Housing

As seen in FIG. 11, the housing 202A is a box-like member configured to cover the solenoid valves V1, V2 protruding from the front side 101A of the base body 100A and the motor M, and to be fixed unitarily to the front side 101A of the base body 100A. As with the first embodiment, the housing 202A is integrally molded from a plastic material. The control board 201A and the coil assemblies 1A are fitted together with the housing 202A.

The housing 202A opens at a rear side thereof that is a side facing to the base body 100A and at a front side thereof that is a side opposite from (facing away from) the base body 100A.

As seen in FIG. 12, the housing 202A includes a board-like bottom portion 210A, a first peripheral wall portion 211A provided on a front side of the bottom portion 210A, and a second peripheral wall portion 212A provided on a rear side of the bottom portion 210A.

The bottom portion 210 has a substantially rectangular profile. The first peripheral wall portion 211A extends frontward from a peripheral edge portion of the bottom portion 210A and is substantially rectangular in its outer peripheral profile. The first peripheral wall portion 211A forms a first receiving chamber 215A (see FIG. 11) for receiving therein the control board 201A having a generally rectangular shape.

The second peripheral wall portion 212A extends rearward from the rear side of the bottom portion 210A and is generally heptagonal in its outer peripheral profile (see FIG. 15). The second peripheral wall portion 212A forms a second receiving chamber 216A (see FIG. 11) for receiving therein the coil assemblies 1A and the motor M. As compared with the configuration of the first embodiment, the size of the second peripheral wall portion 212A is made larger in the front-rear direction for the purpose of accommodating the motor (motor cover) that is larger in size in the axial direction (i.e., front-rear direction) than that of the coil assemblies 1.

As seen in FIGS. 11, 12 and 15, the first receiving chamber 215A and the second receiving chamber 216A are in communication with each other through an opening 256 of the bottom portion 210A. In other words, no partition wall exists between the first receiving chamber 215A and the second receiving chamber 216A. With this configuration of the housing 202A also having no partition wall according to this embodiment, as seen in FIG. 11, the coil assemblies 1A and the motor M are disposed to extend across the second receiving chamber 216A and the first receiving chamber 215A. This makes it possible to accommodate the motor M (motor cover) that is larger in size in the axial direction (i.e., front-rear direction) than that of the coil assemblies 1, while reducing the size by effectively utilizing a space in the front-rear direction.

Figure 18A:
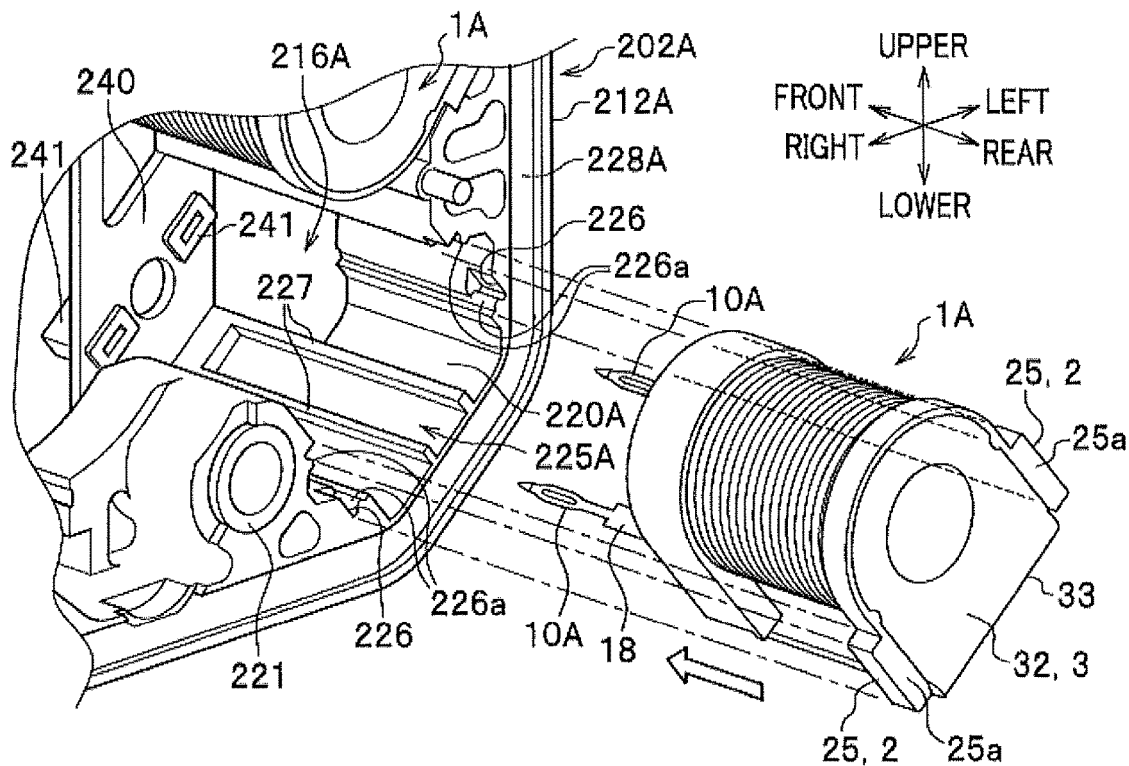

As seen in FIG. 15, a retaining wall 220A having a bumpy surface (with protrusions and recesses) is formed on the rear inner side of the second peripheral wall portion 212A. The retaining wall 220A includes boss portions 221 disposed at upper and lower sides and protruding vertically inward of the second receiving chamber 216A, and a retaining portion 223A disposed at a left side and protruding inward of the second receiving chamber 216A. Two attachment spaces 225A, in total, in which the corresponding coil assemblies 1 are attached, are formed inside the retaining wall 220A, at positions between the retaining portion 223A and the adjacent boss portions 221. The retaining wall 220A in each attachment space 225A has the inner shape same as that of the first embodiment; this inner shape follows the outer shape of the coil assembly 1A. In an open edge portion of each of the attachment spaces 225A, a pair of groove portions 226 are provided, by which the coil assembly 1A is positioned and fixed within the attachment space 225A. In each of the attachment space 225A, the groove portions 226 are formed on the positions opposite to the oppositely arranged retaining wall 220. As seen in FIG. 18A, each groove portion 226 includes projections 226a.

As seen in FIG. 15, a board-like terminal holder 240 is provided in each of the attachment spaces 225A. The terminal holder 240 extends across the upper left side and the lower left side of the retaining wall 220 so that each of the attachment spaces 225A is provided with the terminal holder 240.

The terminal holder 240 includes guide portions 241 each having a substantially rectangular prism-shaped configuration and protruding from the terminal holder 240. The guide portion 241 has a slit-shaped insertion hole 242 (see FIG. 19). The insertion holes 242 are provided at positions corresponding to the press-fit terminals 10A of the coil assemblies 1A to be attached to the attachment spaces 225A. Accordingly, each of the press-fit terminals 10A can be inserted into the corresponding insertion hole 242.

It should be noted that press-fit terminals 252 other than those of the coil assemblies 1A are provided at upper and lower corner portions of the terminal holder 240; the press-fit terminals 252 are embedded in the housing 202A by insertion molding. A guide portion 243 configured to support the press-fit terminal 252 is also provided at each of the upper and lower corner portions of the terminal holder 240 (see FIG. 12).

A peripheral groove 228A is formed at a rear end portion of the second peripheral wall portion 212A. Adhesive for fixing to the front side 101A of the base body 100A is present in the peripheral groove 228A. The housing 202A forms a liquid-tight seal with the front side 101A of the base body 100A using adhesive. An annular-shaped hatched area shown in FIG. 21 by a hatching line S11 and located at the front side 101A of the base body 100A, and linear hatched areas shown by hatching lines S21 and located at positions sandwiching the solenoid valves V1, V2 and corresponding to the ribs 25a contact the peripheral groove 228A and the ribs 25a with adhesive being present therebetween. Application of adhesive on the annular-shaped hatching line S11 and application of adhesive on the linear hatching lines S21 are carried out in the same process.

The housing 202A is mounted to the base body 100A by inserting fastening screws (not shown) through the boss portions 221 of the retaining wall 220A of the second receiving chamber 216A and screwing the fastening screws into screw holes 116 of the base body 100 (see FIG. 13).

The cover member 203 is fixed to an opening formed at the front side of the housing 202A that is the side opposite from the base body 100A.

Configuration of Coil Assembly

Figure 16A:
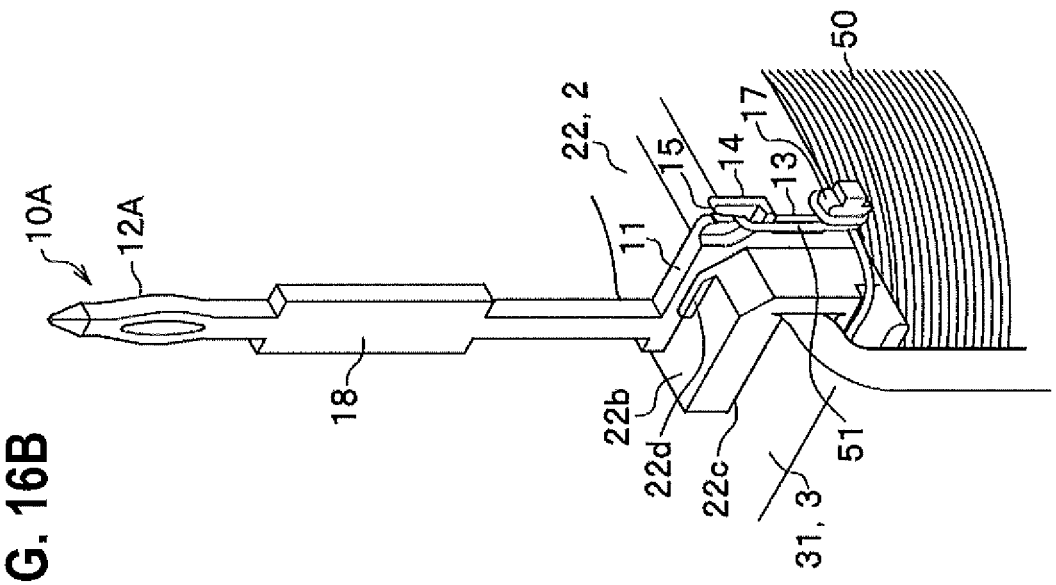
Figure 16B:
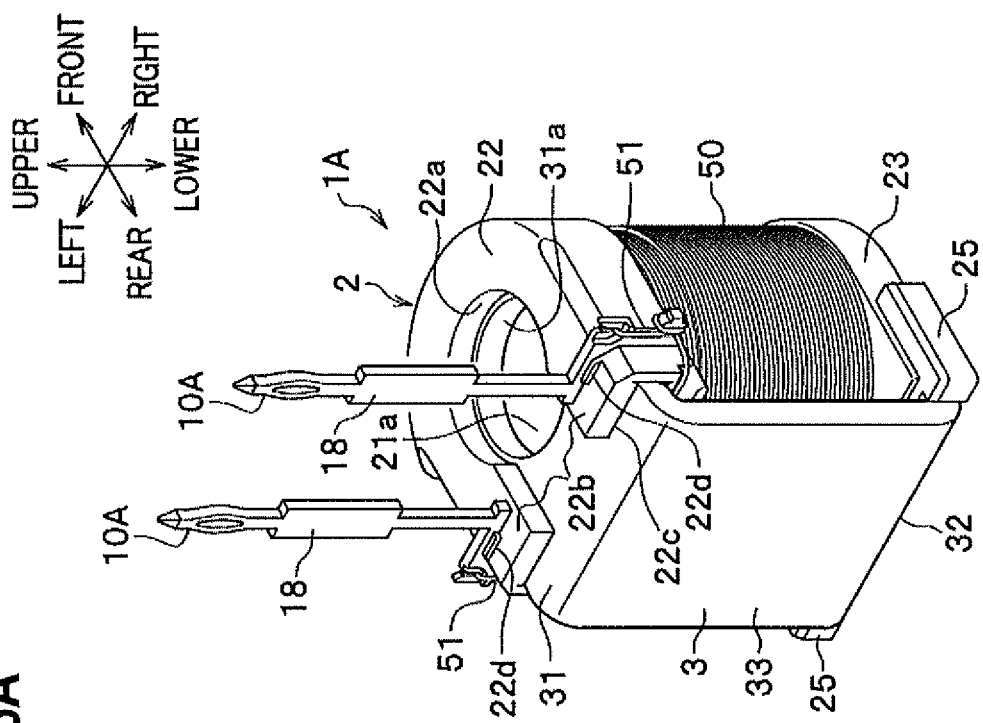
Figure 17A:
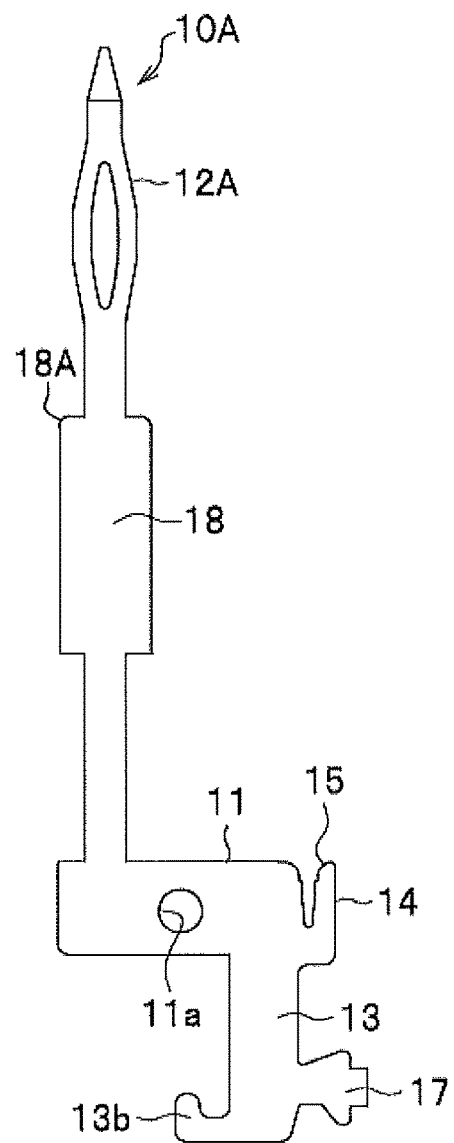
Figure 17B:
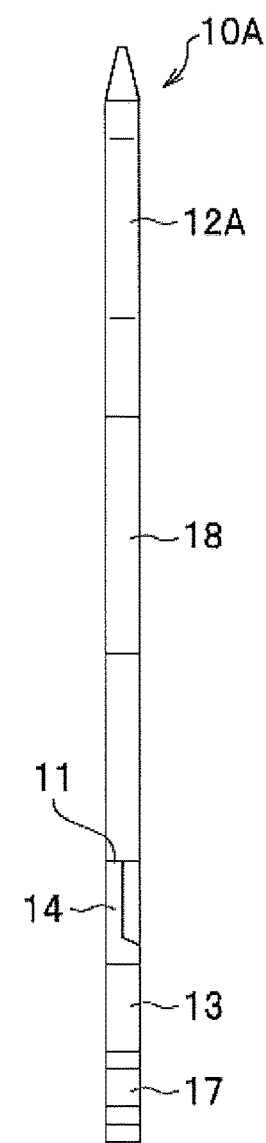
Figure 17C:
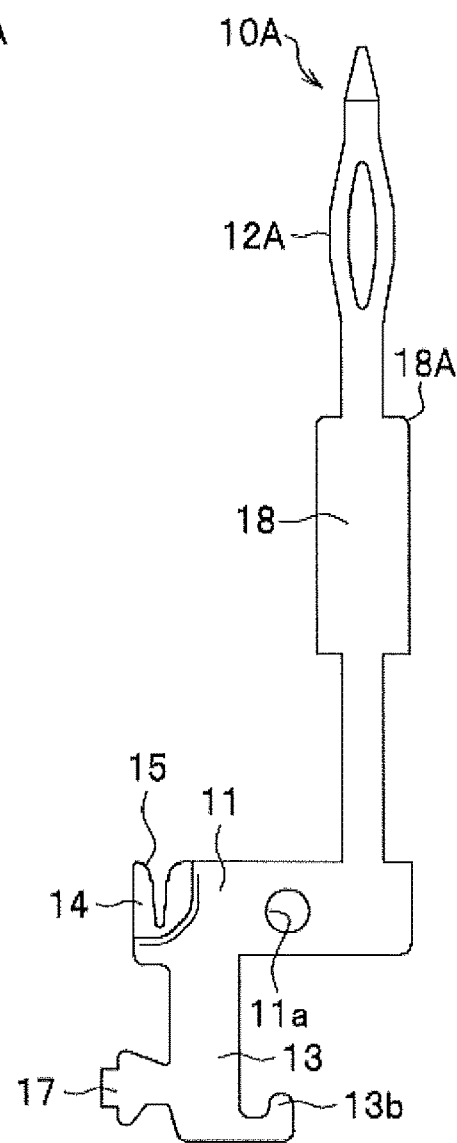

As seen in FIGS. 16 and 17, the coil assembly 1A according to this embodiment is different from the coil assembly 1 according to the first embodiment in that press-fit terminals 10A of the coil assembly 1A are longer in the overall length. The remaining parts of the coil assembly 1A are exactly the same as those of the coil assembly 1.

The press-fit terminal 10A is a metallic component, a part of which is insert molded in the terminal supporting portion 22b of the bobbin 2. As seen in FIG. 16A, the two press-fit terminals 10A, 10A are disposed spaced apart from each other with a predetermined distance in the right-left direction. Respective end portions of the winding 51 are electrically connected to the two press-fit terminals 10A, 10A.

As seen in FIG. 17, each press-fit terminal 10A includes a board-like base portion 11, a terminal portion 12A protruding upward from an upper side end portion of the base portion 11, and a connecting portion 13 protruding downward from a lower side end portion of the base portion 11; the upper side end portion is located at one end portion of the base portion 11, while the lower side end portion is located at the other end portion of the base portion 11.

The terminal portion 12A is longer in the overall length than the terminal portion 12 according to the first embodiment (see FIGS. 7A to 7C). The overall length of the terminal portion 12A is set to conform to the dimension of the second receiving chamber 216A of the housing 202A in the front-rear direction. In other words, since the motor M is received in the second receiving chamber 216A in this embodiment, the second peripheral wall portion 212A is made longer in the front-rear direction as compared with the first embodiment, and thus the overall length of the terminal portion 12A is enlarged accordingly.

Figure 18B:
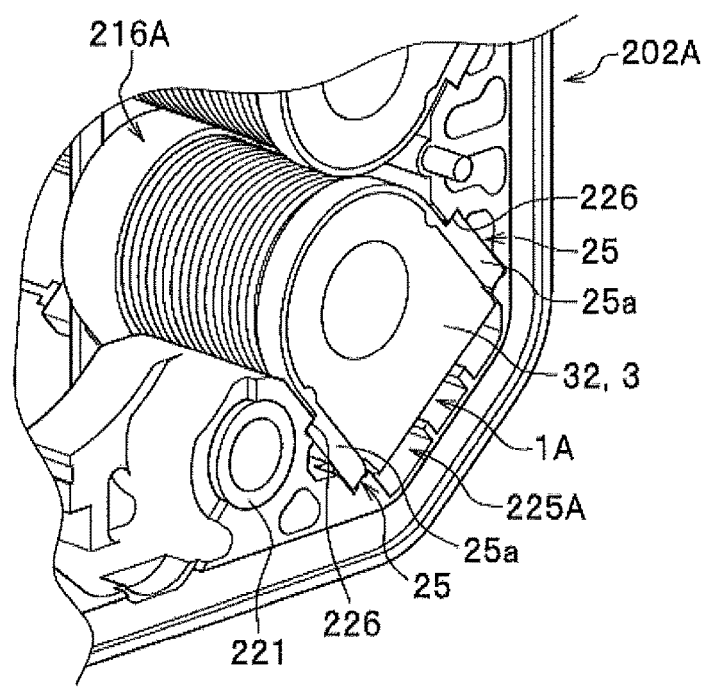
Figure 19:
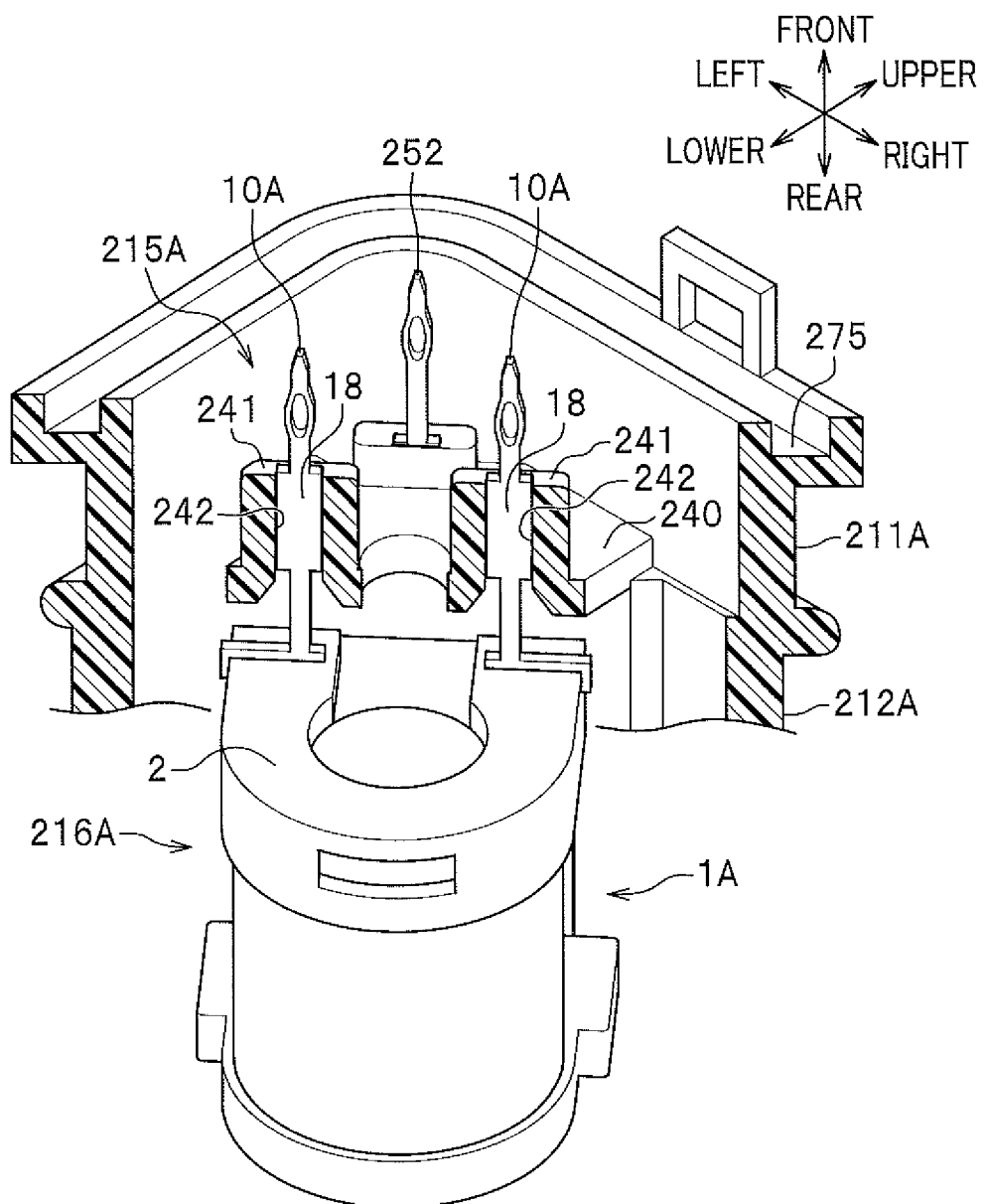
FIG. 19 is an enlarged sectional view illustrating press-fit terminals held in a terminal holder of the housing.
Figure 20:
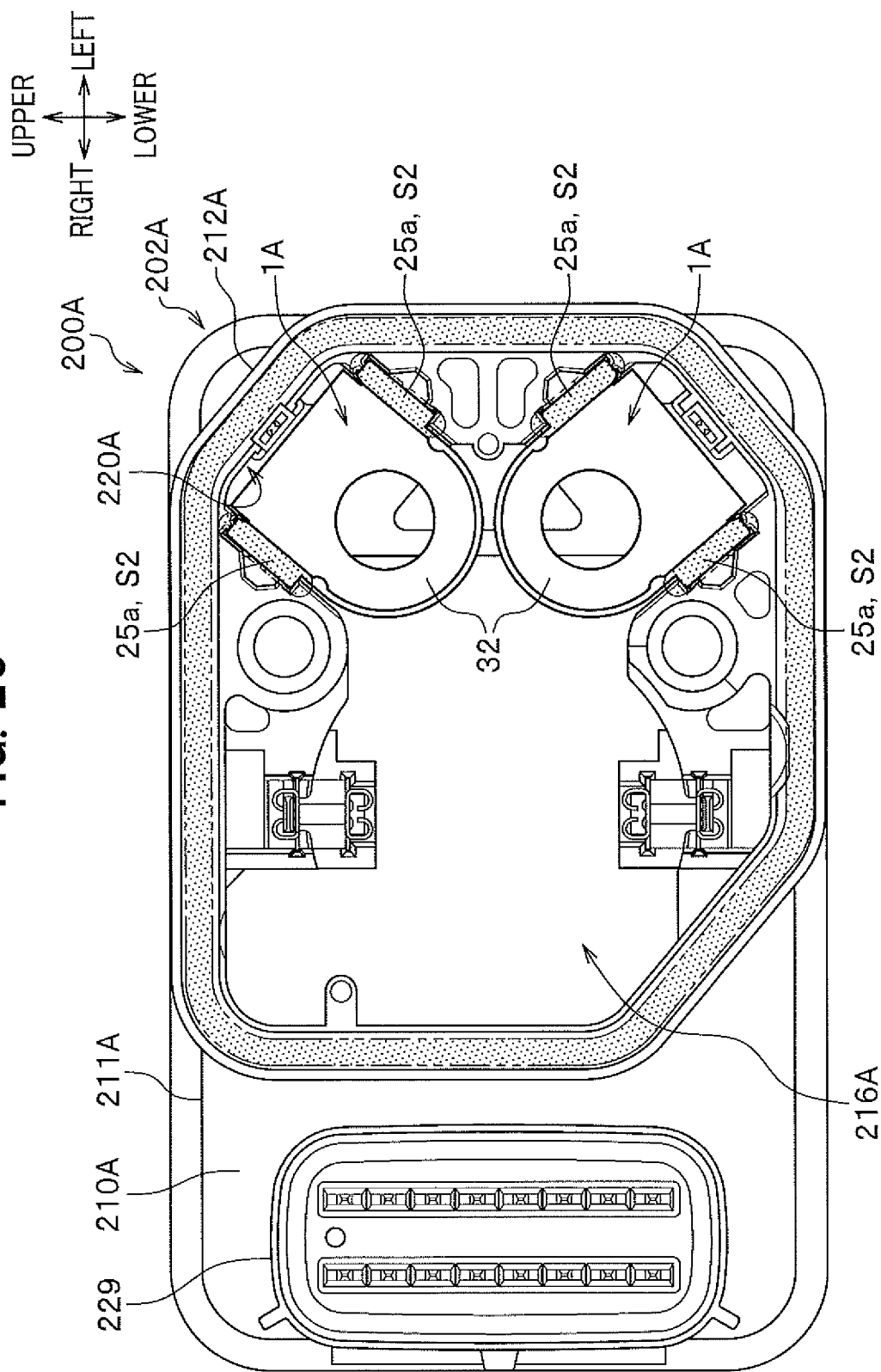
FIG. 20 is a rear view illustrating a housing bonding margin and electric component bonding margins of the electric component assembly according to the second embodiment.

The terminal portion 12A protrudes perpendicularly upward from the upper side end portion of the base portion 11 (toward the axially outer side of the bobbin 2). Provided at a middle portion of the terminal portion 12A is a widened portion 18 that is formed wider than the other portions. As seen in FIG. 19, the widened portion 18 is held by the inner surface of the insertion hole 242 formed in the guide portion 241 of the terminal holder 240 with the coil assembly 1A being fitted together in the attachment space 225A of the housing 202A (see FIG. 18B). In other words, the middle portion of the terminal portion 12A having a large overall length is held by the housing 202A through the terminal holder 240.

Fitting of Coil Assembly Together with Housing

As with the first embodiment, as seen in FIG. 18A, the coil assembly 1A is fitted in the housing 202A from the rear side of the second receiving chamber 216A. At this time, the coil assembly 1A is inserted into the attachment space 225A with the press-fit terminals 10A, 10A being directed toward the attachment space 225A and with the side portion 33 of the yoke 3 being directed toward the reinforcement ribs 227 in the attachment space 225A. It should be noted that the press-fit terminals 10A are shown in simplified form in FIG. 18A.

When the coil assembly 1A is inserted into the attachment space 225A, the terminal portions 12A of the press-fit terminals 10A are inserted into the insertion holes 242 of the terminal holder 240 in the insertion process. In this instance, the terminal portions 12A can be inserted smoothly into the insertion holes 242 because the widened portion 18 of each press-fit terminal 10A has a rounded chamfer portion 18A at one end closer to the terminal portion 12A. Thereafter, the coil assembly 1A is pushed further in the fitting direction, so that the ribs 25, 25 enter the groove portions 226 to complete press-fitting.

By this press-fitting, the coil assembly 1A is positioned in a predetermined position of the second receiving chamber 216A and fixed to the housing 202A.

Fitting of Housing Together with Base Body

After each of the coil assemblies 1A is fitted together with the housing 202A, adhesive is applied to the areas shown by the annular-shaped hatching line S11 and the linear hatching lines S21; the annular-shaped hatching line S11 corresponds to the housing bonding margin S1 located on the front side 101A of the base body 100A at a position associated with the peripheral groove 228A of the housing 202A, and the linear hatching lines S21 correspond to the electric component bonding margins S2 for the lower surfaces 25a of the ribs 25 of the coil assemblies 1A. Thereafter, the housing 202A is moved toward to the front side 101A of the base body 100A, during which the coil assemblies 1A are attached to the solenoid valves V1, V2 protruding at the front side 101A, and then the rear end of the housing 202A is brought into contact with the front side 101A of the base body 100A. Accordingly, the housing 202A and the coil assemblies 1A are bonded to the front side 101A of the base body 100A through the adhesive present between the base body 100A and the housing bonding margin S1 and the electric component boding margins S2. Fastening screws 120 (see FIG. 13) inserted into the boss portions 221 on the retaining wall 220A of the second receiving chamber 216A are screwed into the corresponding screw holes 116 of the base body 100A (see FIG. 13). The housing 202A and the coil assemblies 1A are thereby fixed to the front side 101A of the base body 100A.

Also, according to this embodiment, when the coil assemblies 1A are attached to the solenoid valves V1, V2, the yoke 3 is allowed to move (to move in a direction orthogonal to the axial direction) relative to the bobbin 2 fixed to the housing 202A. Accordingly, even if a slight relative positional shift occurs between each of the solenoid valves V1, V2 and the corresponding coil assembly 1A, this positional shift is absorbed and the coil assemblies 1A can be attached to the solenoid valves V1, V2. The positional shift from the solenoid valve V1, V2 can be absorbed to allow the attachment of the coil assembly 1A, while the press-fit terminals 10A are positioned in predetermined positions.

Fitting of Control Board Together with Housing

After the housing 202A is fitted together with the base body 100A, the control board 201A is fitted together through an opening of the first receiving chamber 215A that opens at the front side of the housing 202A. When assembling, the through-holes 201a of the control board 201A are positioned to the corresponding tip end portions of the press-fit terminals 10A, and then the control board 201A is pushed toward the coil assemblies 1A. The terminal portion 12A of each press-fit terminal 10A is then press-fitted in the through-hole 201a. During this time, the press-fit terminal 10A is retained by the terminal supporting portion 22b of the coil assembly 1A and keeps an upright posture on the terminal supporting portion 22b. Further, the middle portion of the press-fit terminal 10A can be held in the housing 202A by the terminal holder 240.

It should be noted that as seen in FIG. 12, when the control board 201A is fitted together, the press-fit terminals 251 of the bus bar terminal portions 250 and press-fit terminals 253 of a connector portion 229 of the housing 202 can be connected to the control board 201A.

After that, adhesive is applied in a groove 275 provided at the front end portion of the first receiving chamber 215A (see FIG. 12), and the cover member 203 is secured in liquid-tight manner. It should be noted that engagement portions 255 are provided at the front end portion and hook portions (not shown) are provided on the cover member 203, so that the positioning can be performed with ease by the engagement between the engagement portions 255 and the hook portions. Accordingly, the assembly is completed.

According to this embodiment as described above, the same operational advantages described above in the first embodiment can be obtained. Further, the middle portion of the press-fit terminal 10A can be inserted into and held by the terminal holder 240 of the housing 202A. With this configuration, even if the overall length of the press-fit terminal 10A is long, the middle portion thereof can be held by the housing without failure; this makes it possible to prevent the press-fit terminal 10A from being bent down or toppling over and thus to ensure the connection of the coil assembly 1A to the control board 201A.

Further, even if the control board 201A and the coil assemblies 1A are spaced apart for some distance, the coil assemblies 1A can be connected to the control board 201A without failure, so that the degree of freedom in designing the layout of the coil assemblies 1A within the housing 202A can be improved.

Further, the widened portion 18 having the width wider than the remaining portions is provided at the middle portion of the press-fit terminal 10A. Accordingly, the middle portion of the press-fit terminal 10A can be held by the inner surface of the insertion hole 242 through the widened portion 18. This makes it possible to prevent the press-fit terminal 10A from being bent down or toppling over in a more effective manner.

Although the present invention has been described with reference to some exemplary embodiments, the present invention is not limited to the specific configurations of the above-described embodiments. It is to be understood that various changes or modifications may be made to any of the specific configurations without departing from the gist of the appended claims. Further, it is to be understood that the configurations of the above-described embodiments may be changed or modified by partly adding, deleting or replacement of a component.

For example, the rectangular prism-shaped ribs 25 have been exemplified; however, the shape of the rib is not limited thereto, and various shaped ribs may be used. Further, the number of the ribs 25 may be one or more than three.

Further, the coil assembly 1 (1A) has the ribs 25, while the housing 202 (202A) has the groove portions 226. However, as an alternative, the coil assembly 1 (1A) may have the groove portions, while the housing 202 (202A) may have the ribs.

Instead of using the press-fit terminal 10 (10A) as a connecting terminal, other terminals such as a snap-fit terminal and a frictionally contactable terminal may be employed as a connecting terminal.

Further, as long as the press-fit terminal 10 includes a terminal portion 12 protruding upward from the bobbin 2, the connecting portion 13 and/or other portions of the press-fit terminal 10 may be disposed, for example, on a side portion of the bobbin 2.

Further, the exemplified press-fit terminal 10 is embedded in the bobbin 2 by insertion molding. However, the present invention is not limited to this specific configuration, and the bobbin 2 may be retrofitted with the press-fit terminal 10.

Further, the present invention has been exemplified as a configuration including the coil assembly 1 (1A) as an electric component. However, the present invention may be preferably implemented to other electric components to be fitted together with the housing 202 (202A).

Further, instead of applying adhesive on the front side 101 (101A) of the base body 100 (100A), the adhesive may be applied in advance to the housing 202 (202A) and the coil assembly 1 (1A; electric component).

DESCRIPTION OF REFERENCE NUMERALS 1, 1A coil assembly (electric component)
2 bobbin
3 yoke
25 rib
50 coil
51 winding
10, 10A press-fit terminal
200 electric control unit (electric component assembly)
201 control board (circuit board)
201a through-hole
202, 202A housing
V1, V2 solenoid valve
U, U1 brake fluid pressure control device for vehicles

The invention claimed is:

1. An electric component assembly comprising:
an electric component; and
a housing with which the electric component is fitted together; the electric component and the housing being fixed to one side of a base body,
wherein the electric component includes a connecting terminal configured to be press-fitted in a through-hole of a circuit board installed in the housing, and a direction in which the connecting terminal is inserted into the through-hole is same as a fitting direction of the electric component relative to the housing,
wherein the electric component assembly includes a rib protruding from one of the electric component and the housing, and a groove portion recessed from another one of the electric component and the housing and into which the rib is press-fitted,
wherein movement of the electric component in a direction intersecting the fitting direction and rotation of the electric component around an axis parallel to the fitting direction are restrained by the rib press-fitted into the groove portion, and
wherein the rib is configured to provide an electric component bonding margin for bonding the electric component assembly to a front side of the base body using an adhesive when the rib is press-fitted into the groove portion.

2. The electric component assembly according to claim 1, wherein the connecting terminal is a press-fit terminal.

3. The electric component assembly according to claim 1, wherein the electric component is a coil assembly configured to drive a solenoid valve, and
wherein the coil assembly includes:
a bobbin;
a coil comprising a winding around the bobbin;
a yoke mounted on the bobbin; and
the connecting terminal electrically connected to the winding.

4. A brake fluid pressure control device for vehicles comprising the electric component assembly according to claim 3, and configured to be connected between a master cylinder and a wheel brake and to control brake fluid pressure acting on the wheel brake,
wherein the solenoid valve is mounted on the base body, and the coil assembly is attached to the solenoid valve.

5. The electric component assembly according to claim 2, wherein the electric component is a coil assembly configured to drive a solenoid valve, and
wherein the coil assembly includes:
a bobbin;
a coil comprising a winding around the bobbin;
a yoke mounted on the bobbin; and
the connecting terminal electrically connected to the winding.

6. A brake fluid pressure control device for vehicles comprising the electric component assembly according to claim 5, and configured to be connected between a master cylinder and a wheel brake and to control brake fluid pressure acting on the wheel brake,
wherein the solenoid valve is mounted on the base body, and the coil assembly is attached to the solenoid valve.

7. The electric component assembly according to claim 1, wherein said rib is a quadrangular prism-shaped rib.

\* \* \* \* \*